(12) United States Patent
Mine

(10) Patent No.: US 7,867,853 B2
(45) Date of Patent: Jan. 11, 2011

(54) METHOD OF MANUFACTURING SEMICONDUCTOR DEVICE AND SEMICONDUCTOR FIN-SHAPED CHANNEL

(75) Inventor: Teruyuki Mine, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/337,740

(22) Filed: Dec. 18, 2008

(65) Prior Publication Data

US 2009/0166726 A1 Jul. 2, 2009

(30) Foreign Application Priority Data

Dec. 27, 2007 (JP) .............................. 2007-337378

(51) Int. Cl.
 *H01L 21/336* (2006.01)
(52) U.S. Cl. ................ 438/270; 257/329; 257/E29.262
(58) Field of Classification Search ........................ None
 See application file for complete search history.

(56) References Cited

U.S. PATENT DOCUMENTS

| 5,963,841 | A * | 10/1999 | Karlsson et al. ............. 438/585 |
| 7,153,733 | B2 * | 12/2006 | Seo et al. .................... 438/197 |
| 7,396,711 | B2 * | 7/2008 | Shah et al. ................... 438/164 |
| 2004/0007738 | A1 * | 1/2004 | Fried et al. .................. 257/329 |
| 2004/0262687 | A1 * | 12/2004 | Jung et al. ................... 257/347 |

FOREIGN PATENT DOCUMENTS

| JP | 2006-005344 | 1/2006 |
| JP | 2006-279010 | 10/2006 |
| JP | 2006-310458 | 11/2006 |
| JP | 2007-042790 | 2/2007 |

* cited by examiner

*Primary Examiner*—Evan Pert
*Assistant Examiner*—Andres Munoz
(74) *Attorney, Agent, or Firm*—Young & Thompson

(57) ABSTRACT

There are provided a method of manufacturing a semiconductor device which is capable of narrowing only the width of a Fin channel while maintaining the widths of source and drain regions, and a semiconductor device. The method of manufacturing a semiconductor device is a method of manufacturing a Fin type transistor, including: forming STI region 2 with use of mask layer 8 formed over silicon substrate 1 as a mask; narrowing mask layer 8 by wet etching to form narrowed mask layer 8*a*; forming stopper oxide film 16 over a surface of narrowed mask layer 8*a*, depositing polysilicon 17 over an entire surface and then forming anti-reflective film 18 and photoresist 19; forming an opening at photoresist 19 in a portion corresponding to a word line portion, removing anti-reflective film 18 and polysilicon 17 in that portion to expose narrowed mask layer 8*a* and then removing photoresist 19; and forming Fin channel 30 by etching portions of silicon substrate 1 which lie on opposite sides of and below narrowed mask layer 8*a* with narrowed mask layer 8*a* as a mask.

11 Claims, 27 Drawing Sheets

Fig. 8
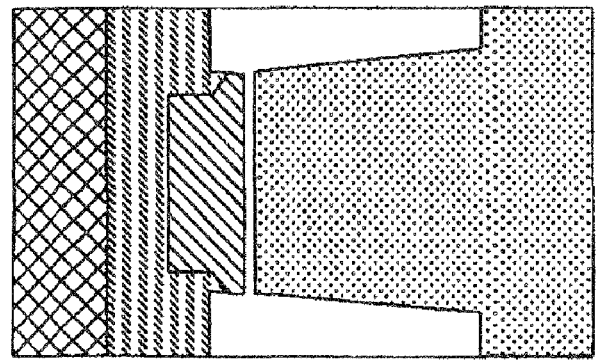
(d) Peripheral circuit
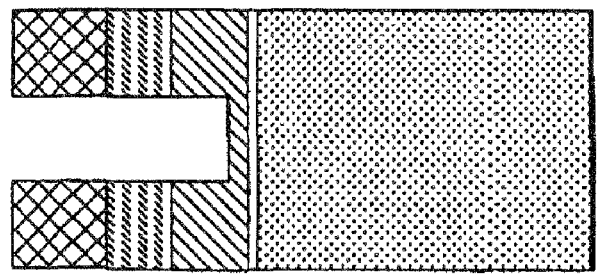
(c) C-C'
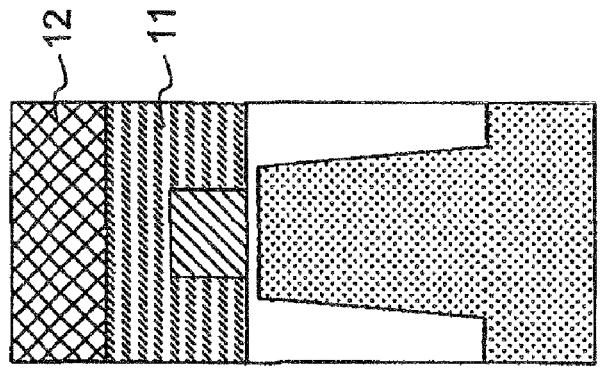
(b) B-B'
12
11
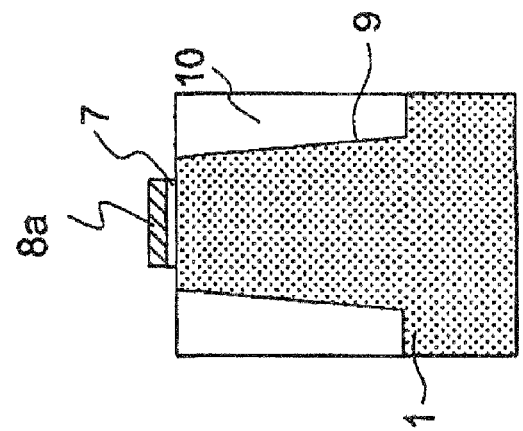
(a) A-A'
7
8a
10
9
1

Fig. 13
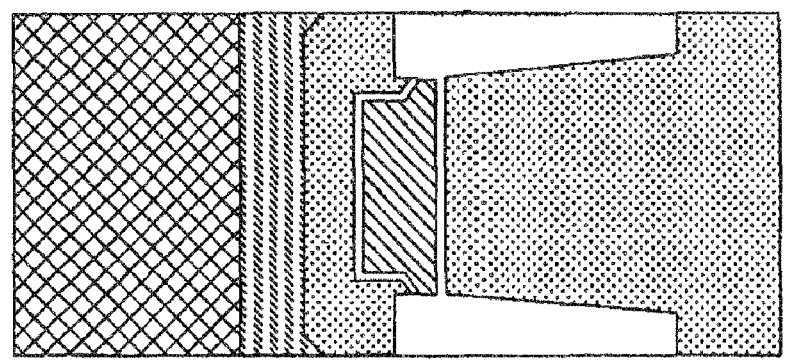
(a) A-A'
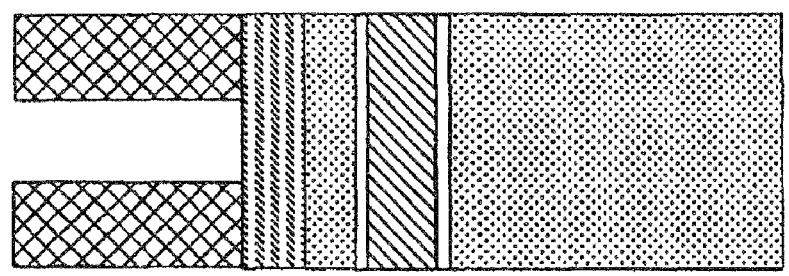
(b) B-B'
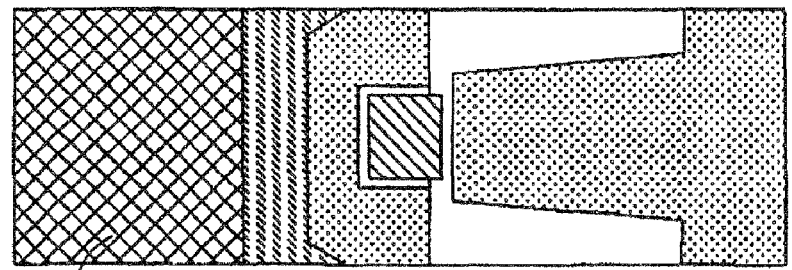
(c) C-C'
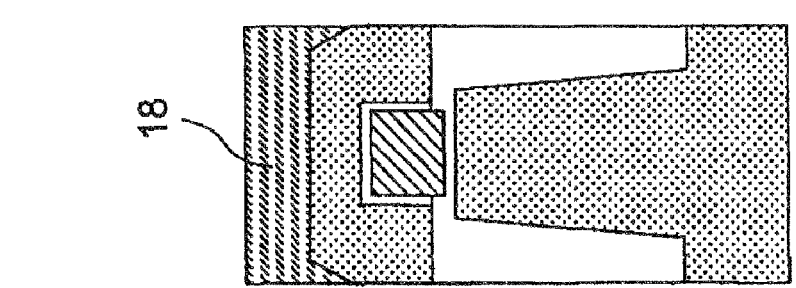
(d) Peripheral circuit

METHOD OF MANUFACTURING SEMICONDUCTOR DEVICE AND SEMICONDUCTOR FIN-SHAPED CHANNEL

This application is based upon and claims the benefit of priority from Japanese patent application No. 2007-337378, filed on Dec. 27, 2007, the disclosure of which is incorporated herein in its entirety by reference.

BACKGROUND OF THE INVENTION

1. Field of the Invention

An exemplary aspect of the invention relates to a method of manufacturing a semiconductor device and a semiconductor device. More specifically, an exemplary aspect of the invention relates to a method of manufacturing a semiconductor device for manufacturing a. Fin type transistor in an active region surrounded by a device isolation (STI, Shallow Trench Isolation) region, and a semiconductor device.

2. Description of the Related Art

In recent years, miniaturization of semiconductor elements such as transistors has been progressing in semiconductor devices including DRAM (Dynamic Random Access Memory) to meet requests for a higher integration density and a higher operating speed. With respect to a transistor having a conventional planar structure, it has been difficult to suppress the short channel effect when the gate length of a transistor formed according to the minimum fabrication dimension is 90 nm or less. To overcome this, study has been made of use of a Fin type transistor wherein a Fin-shaped portion (also called a Fin channel) is formed by working a semiconductor substrate into a three-dimensional structure having island-like portions with projecting surfaces and wherein a side surface of such a projecting island is used as a channel.

Fin type transistors are described in Japanese Patent Application Laid-Open Nos. 2006-279010, 2006-310458, 2007-42790 and 2006-5344. Particularly, Japanese Patent Application Laid-Open Nos. 2006-279010, 2006-310458 and 2007-42790 each describes a process wherein a Fin channel is previously formed using a combination of a mask and RIE (Reactive Ion Etching) for example, for example; wherein a STI region or air insulation is provided on opposite sides of the Fin channel; and wherein the Fin channel is exposed in a later step.

Conventional Fin type transistors have a problem described below. FIG. 27 shows one exemplary plane layout of a memory cell array of DRAM. Memory cell array 100A of DRAM includes STI regions 102 and active regions 103 each surrounded by STI regions 102. One active region 103 is provided with two gate electrodes 104. Gate electrodes 104 each represented as a diagonally shaded area in FIG. 27 serve also as word lines. Source regions 105 are provided on opposite outer sides of two gate electrodes 104 forming a pair, while common drain region 106 is provided inside the pair.

Since STI regions 102 and active regions 103 are formed based on a minimum fabrication dimension determined by a resolution limit of lithography, there is no margin for working in the plane. For this reason, in forming a Fin channel with the narrow width Lg of gate electrode 104 (i.e., the width of a channel region) in active region 103, the width Ls of source region 105 and the width Ld of drain region 106, which are located adjacent to the channel region, are inevitably narrowed. As a result, the areas of the top surfaces of source regions 105 and drain regions 106 become smaller, so that the contact resistance between each of them and a respective one of contact plugs formed on the top surfaces increases, thereby raising a problem of a delayed circuit operation.

The techniques described in Japanese Patent Application Laid-Open Nos. 2006-279010, 2006-310458 and 2007-42790 have a problem that it is difficult to form a Fin channel as designed because the shape of a mask (film pattern) used in the formation of the STI regions for example is impaired by a later process.

An exemplary object of the invention is to provide a method of manufacturing a semiconductor device which is capable of forming a Fin channel as designed, as well as a semiconductor device.

Another exemplary object of the invention is to provide a method of manufacturing a semiconductor device which is capable of narrowing only the width of a Fin channel while maintaining the widths of source and drain regions located adjacent to a channel region, as well as a semiconductor device.

SUMMARY OF THE INVENTION

In order to accomplish the foregoing objects, an exemplary aspect of the invention provides a method of manufacturing a semiconductor device, comprising:

forming an active region and a device isolation region by selectively etching a surface of a semiconductor substrate with use of a film pattern as an etching mask;

narrowing a width of the film pattern;

forming a Fin channel and a gate trench by further etching a surface of the active region with use of a reversed pattern of a gate electrode pattern and the film pattern thus narrowed as etching masks;

forming a gate insulating film over a surface of the Fin channel and over a bottom portion of the gate trench; and forming a gate electrode covering the gate insulating film and filling up the gate trench.

An exemplary aspect of the invention also provides a method of manufacturing a semiconductor device, comprising:

forming an isolation region surrounding an active region in a semiconductor substrate, wherein a first film pattern over the active region as an etching mask for making an isolation trench at the isolation region, and an insulation film fills in the isolation trench;

narrowing a width of the first film pattern;

forming a second film pattern over the active region, wherein source and drain regions of the active region are covered by the second film pattern, and the first film pattern at a channel region of the active region is exposed;

forming a gate trench at a portion of the channel region by etching the semiconductor substrate between the isolation region and the first film pattern;

forming a gate insulating film on a surface of both the channel region and the gate trench; and forming a gate electrode on the gate insulating film.

An exemplary aspect of the invention also provides a semiconductor device comprising a MISFET having a Fin channel, wherein source and drain regions each has the same width as an active region, while the Fin channel has a smaller width than the active region.

According to the method of manufacturing a semiconductor device of an exemplary aspect of the invention, the film pattern used in the formation of the active region and the device isolation region is narrowed inwardly of the active region without impairment and hence can be used as an etching mask for the formation of the Fin channel and the gate trench. As a result, the Fin channel can be formed as designed; for example, only the width of the Fin channel can be made smaller than the width of each of the source and drain regions.

According to the semiconductor device of an exemplary aspect of the invention, source and drain regions each has a width kept equal to the initial width of the active region and hence can maintain the areas of their respective top surfaces, thus making it possible to prevent an increase in contact resistance. Further, the width of the Fin channel is made narrower than the initial width of the active region, thus ensuring a minute Fin channel.

BRIEF DESCRIPTION OF THE DRAWINGS

FIG. 8 includes sectional views showing a state in which a surface of a silicon substrate is exposed by etching an oxide film by a thickness equal to the thickness of a pad oxide film;

FIG. 13 includes sectional views showing a state resulting from exposure and development performed using a reticle having a reversed pattern of a gate electrode;

DETAILED DESCRIPTION OF THE PREFERRED EMBODIMENTS

Hereinafter, exemplary embodiments will be described in detail with reference to the drawings.

First Exemplary Embodiment

Figure 1:
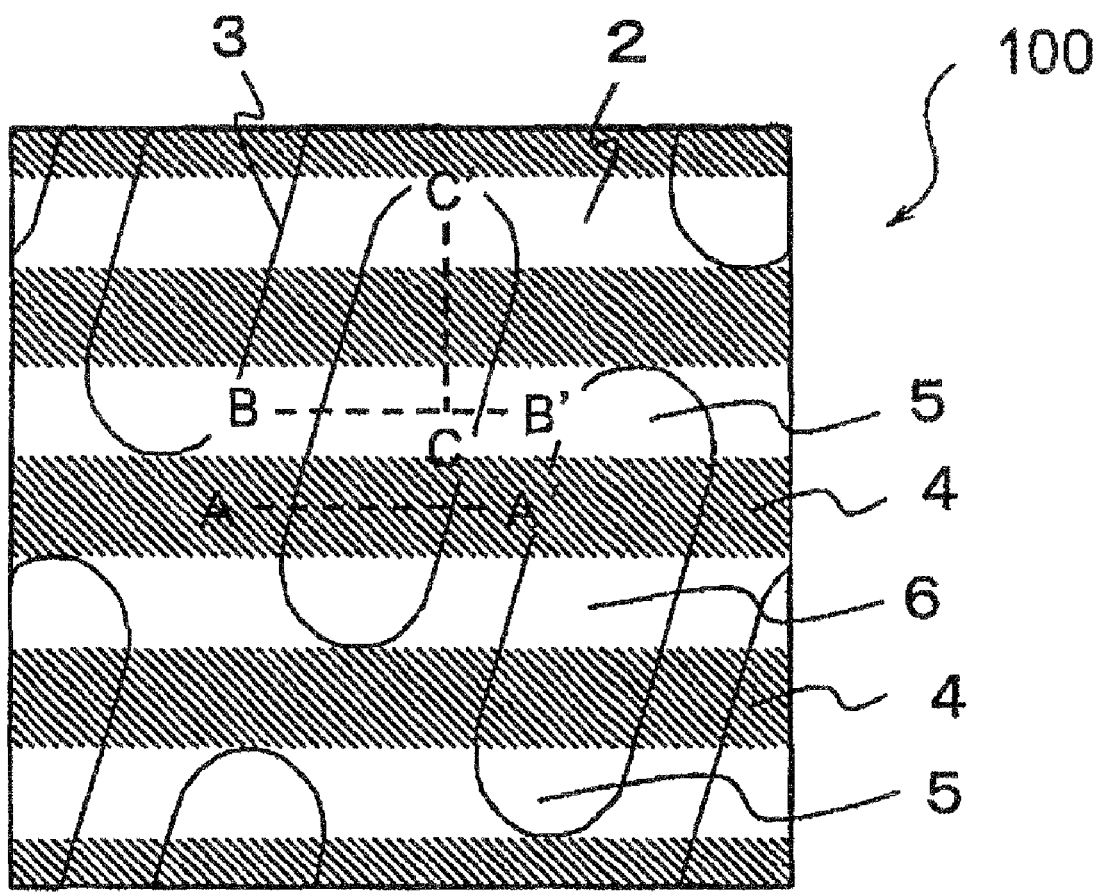
FIG. 1 is a view showing one exemplary plane layout of a memory cell array to which a method of manufacturing a semiconductor device according to an exemplary embodiment is applied.

A manufacturing method according to a first exemplary embodiment is described below with reference to FIGS. 1 to 9. In this method, a Fin type transistor is formed while the width of an active region that will form each of source and drain regions is different from the width of an active region that will form a channel region under a gate electrode. FIG. 1 is a view showing one exemplary plane layout of a memory cell array to which the method of manufacturing a semiconductor device according to a first exemplary embodiment is applied. Memory cell array 100 includes STI region 2 formed on semiconductor substrate 1 (hereinafter will be referred to as "silicon substrate", see FIG. 2) for example, and a plurality of active regions 3 each surrounded by STI region 2. The plurality of active regions 3 are arranged regularly. One active region 3 is provided with two gate electrodes 4 extending thereacross, which serve also as word lines. Source regions 5 are located at portions of active region 3 which are situated outside two gate electrodes 4 forming a pair. Drain region 6 is located in a substantially central portion of active region 3 which is situated inside two gate electrodes 4. A bit line connected to drain region 6 via a contact plug not illustrated here extends over drain region 6 so as to cross the word lines at right angles. Source regions 5 are each provided with a capacitative element thereon. In the following description, a width of active region 3 on a shorter side (hereinafter will be simply referred to as "width") is set to 100 nm and a width of STI region 2 between adjacent active regions 3 is set to 80 nm, as typical examples.

Manufacturing steps will be described with reference to respective Figures each including sectional views (a) to (c) taken on line A-A', line B-B' and line C-C' of FIG. 1, respectively, and a sectional view (d) showing a transistor formed in a peripheral circuit portion. Here, the peripheral circuit portion is shown in section in each view (d) for the purpose of describing that the manufacturing method according to the present exemplary embodiment is capable of forming a Fin channel in a specific region, i.e., in memory cell array 100 only. That is, since the peripheral circuit portion includes various metal insulator semiconductor field effect transistors (MISFETs) that are different in characteristics from each other, the manufacturing method takes into consideration a possibility that an inconvenience occurs on the contrary if all are formed as Fin type transistors. The sectional view of the peripheral circuit portion is taken in a direction perpendicular to gate electrodes 4.

Figure 2:
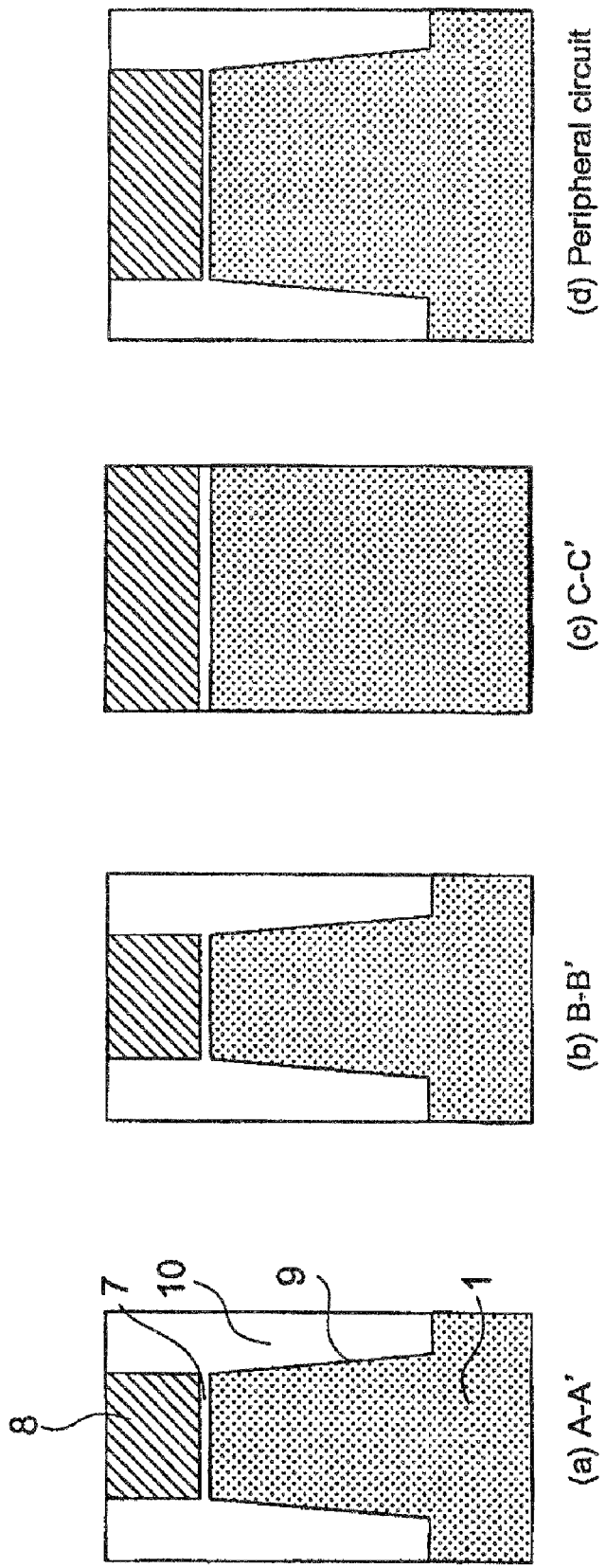
FIG. 2 includes sectional views showing a state of being filled with a STI insulating film.

FIG. 2 includes sectional views showing respective portions in a state of being filled with a STI insulating film. Initially, silicon substrate 1 made of P-type single crystal silicon is thermally oxidized to form pad oxide film 7 having a thickness of about 10 nm on a surface thereof. Subsequently, a silicon nitride film is deposited to a thickness of about 10 to 150 nm by CVD (Chemical Vapor Deposition). Thereafter, portions of the silicon nitride film and pad oxide film that are present in a region which will form STI region 2 are removed by photolithography and dry etching using a fluorocarbon-type gas, while mask layer 8 consisting of the silicon nitride film is left on active region 3. Further, after photoresist has been peeled off using an acid or the like, a portion of silicon substrate 1 which will form STI region 2 is subjected to dry etching using a chlorine-type gas to form STI trench 9. The depth of STI trench 9 is about 200 nm.

Subsequently, after a thermal oxide film having a thickness of about 10 nm has been formed over an internal surface of STI trench 9, STI insulating film 10 consisting of a silicon oxide film is deposited by CVD to such an extent as to sufficiently fill up STI trench 9 including an opening defined by mask layer 8. STI insulating film 10 thus deposited in STI trench 9 has a step reflecting the difference in pattern between memory cell array 100 and the peripheral circuit portion or the like. For this reason, the step is planarized by a CMP (Chemical Mechanical Polishing) process. By the CMP process, the thickness of mask layer 8 comprising the silicon nitride film is reduced to 70 nm. At this stage, mask layer 8 is formed over silicon substrate 1 in active region 3 via intervening pad oxide film 7 and is surrounded by STI insulating film 10 in the A-A' and B-B' sections and in the section of the peripheral circuit portion as shown in drawings. In the C-C' section, mask layer 8 is formed over silicon substrate 1 via intervening pad oxide film 7.

Figure 3:
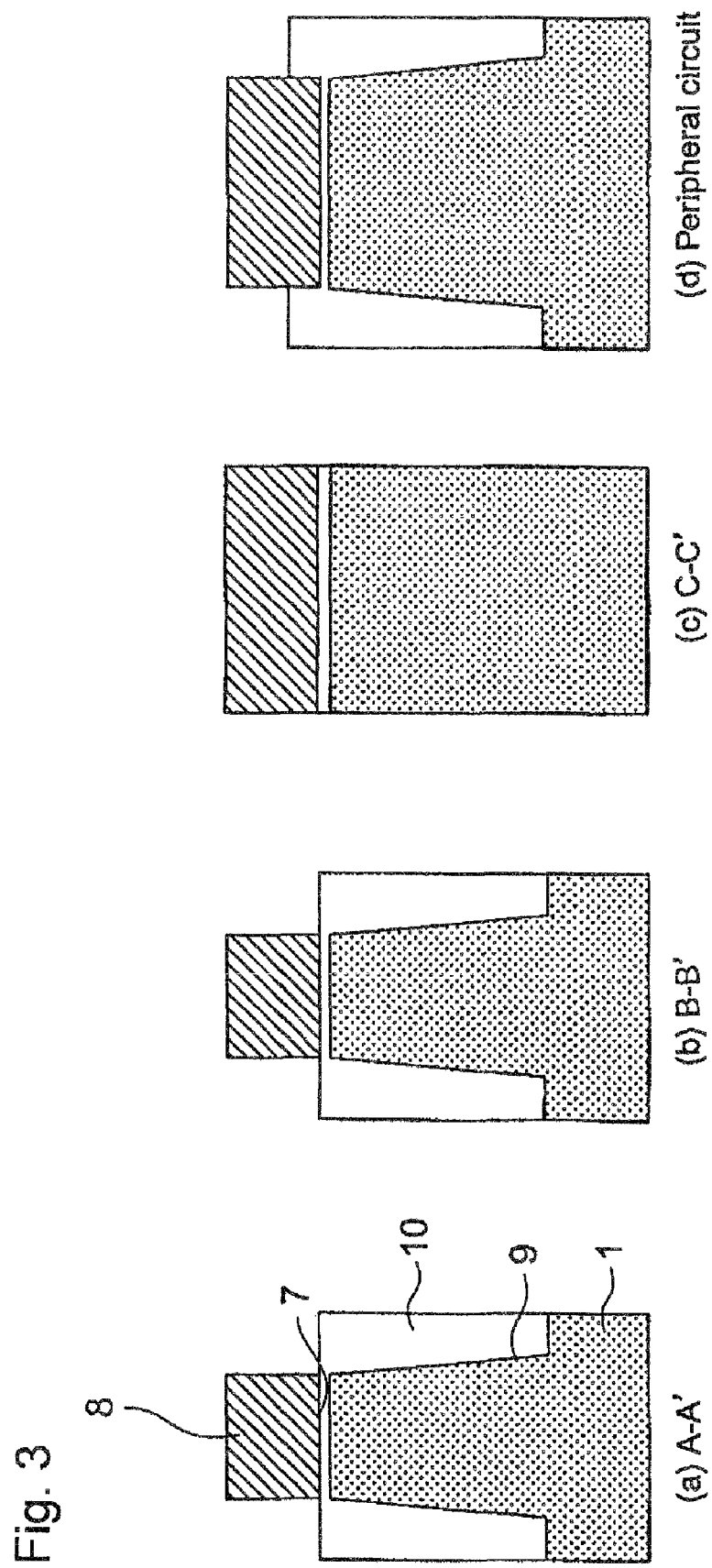
FIG. 3 includes sectional views showing a state resulting from etching back of the STI insulating film.

Subsequently, as shown in FIG. 3, STI insulating film 10 comprising the silicon oxide film is etched back to a position adjacent the boundary between mask layer 8 and pad oxide film 7 by time-specified wet etching using a hydrofluoric acid solution or the like.

In subsequent steps, silicon oxide is subjected to wet etching several times during a period until deposition of gate electrode 4. For this reason, STI region 2 is dented to a position lower than active region 3 in some cases. In such a case, a shoulder portion of an active region of the peripheral circuit portion, in particular, is exposed to form a subchannel that is difficult to control, which may cause the subthreshold characteristics of a transistor to be hampered. To avoid this, it is desirable that the peripheral circuit portion is covered with photoresist; that only memory cell array 100 is wet etched once; the photoresist is peeled off; and memory cell array 100 and the peripheral circuit portion are wet etched; to make the heights of their STI regions different from each other.

At the stage of FIG. 3, STI insulating film 10 is in a state of being etched back to a position coinciding with the surface of pad oxide film 7 in the A-A' and B-B' sections shown. In the section of the peripheral circuit portion, STI insulating film 10 is in a state of being etched back to a position higher than the surface of pad oxide film 7. In the C-C' section, there is no change.

Figure 4:
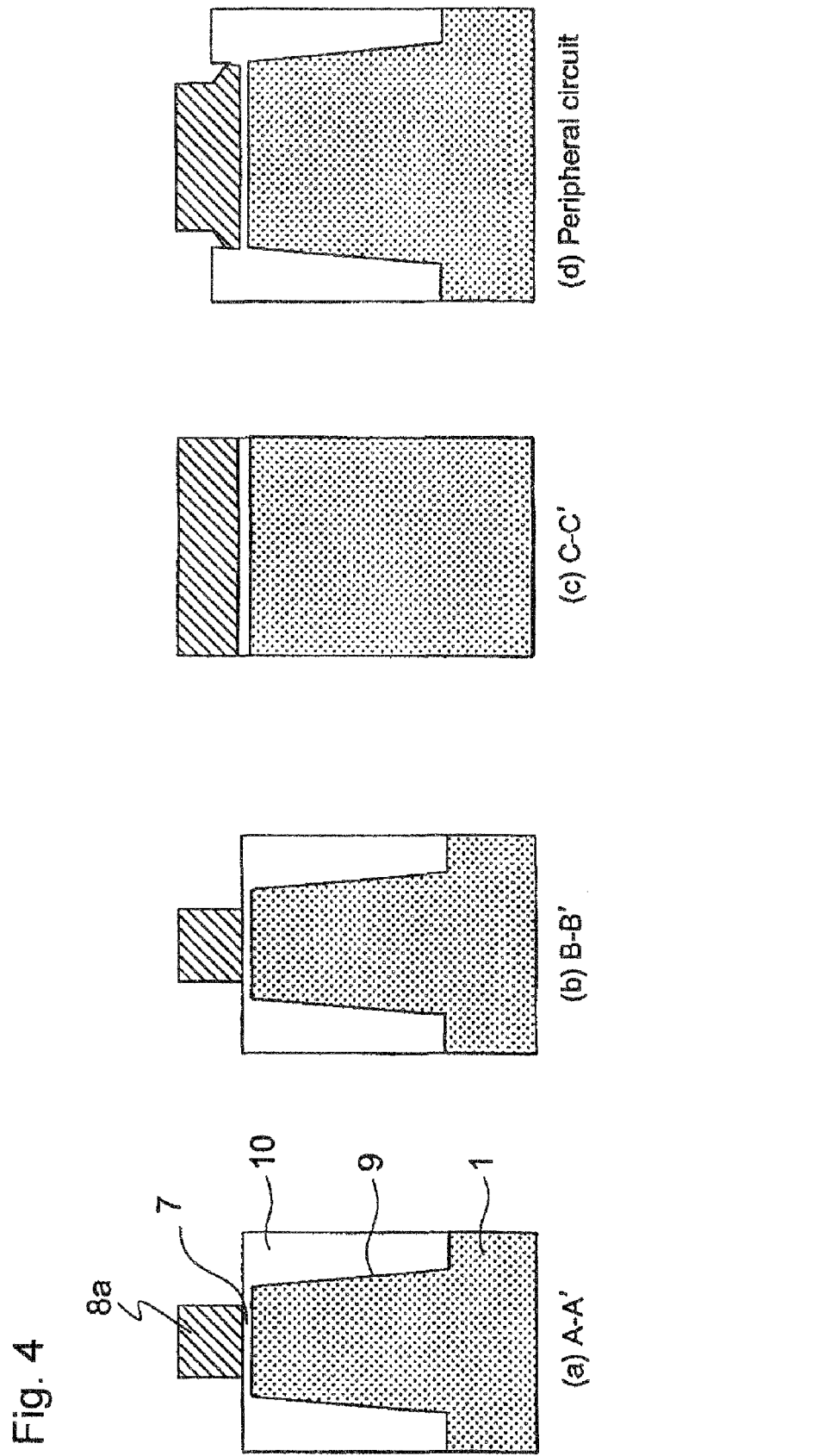
FIG. 4 includes sectional views showing a state resulting from formation of a narrowed mask layer by narrowing the width of a mask layer.

Subsequently, as shown in FIG. 4, the width of mask layer 8 is narrowed by time-specified wet etching using a phosphoric acid ($H_3PO_4$), thus forming narrowed mask layer 8a. Narrowed mask layer 8a typically has a width of 50 nm. The width of narrowed mask layer 8a is set to 50 nm because active region 3 having a width of 100 nm is etched by 25 nm from either side by the phosphoric acid wet etching. The thickness of narrowed mask layer 8a is 45 nm because mask layer 8 polished by the CMP process to have a thickness of 70 nm is etched by 25 nm by the phosphoric acid wet etching. The wet etching for narrowing mask layer 8 consisting of the silicon nitride film was achieved by immersion in a hot phosphoric acid at 150° C. for three minutes. The wet etching is not limited to the conditions mentioned above and the etching time can be determined based on an etching rate determined directly in accordance with the temperature of the hot phosphoric acid. When the temperature is too high, the etching rate is too high to control etching. When the temperature is too low, on the other hand, etching does not proceed. For this reason, the temperature of the hot phosphoric acid is desirably set to fall within a range from 145 to 165° C. for example.

At the stage of FIG. 4, mask layer 8 is narrowed inwardly of active region 3 to form narrowed mask layer 8a in the A-A' and B-B' sections shown. In the section of the peripheral circuit portion, a portion of mask layer 8 at a position higher than the surface of STI insulating film 10 is narrowed. In the C-C' section, there is no change.

Figure 5:
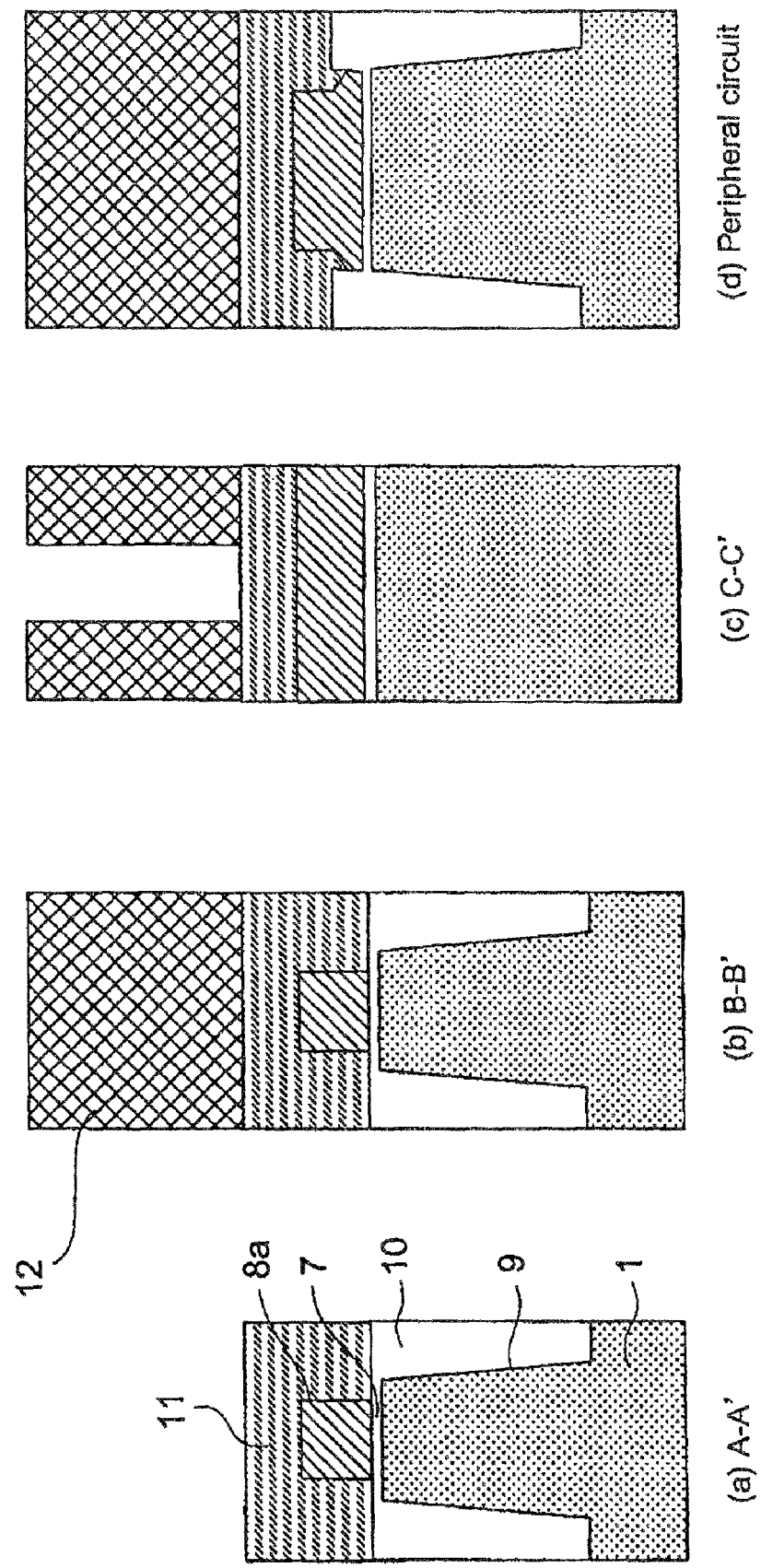
FIG. 5 includes sectional views showing a state resulting from formation of an anti-reflective film by spin coating.

Subsequently, as shown in FIG. 5, anti-reflective film 11 made of an organic polymer is formed by spin coating or the like. Anti-reflective film 11 prevents light emitted in lithography from reflecting at an uneven surface of lo silicon substrate 1 to reach photoresist formed over the surface. In this exemplary embodiment, anti-reflective film 11 is set to have a thickness of 90 nm from the surface of STI insulating film 10. However, the thickness of anti-reflective film 11 can be varied appropriately in view of the conditions of lithography without limitation to the value noted above.

Figure 6:
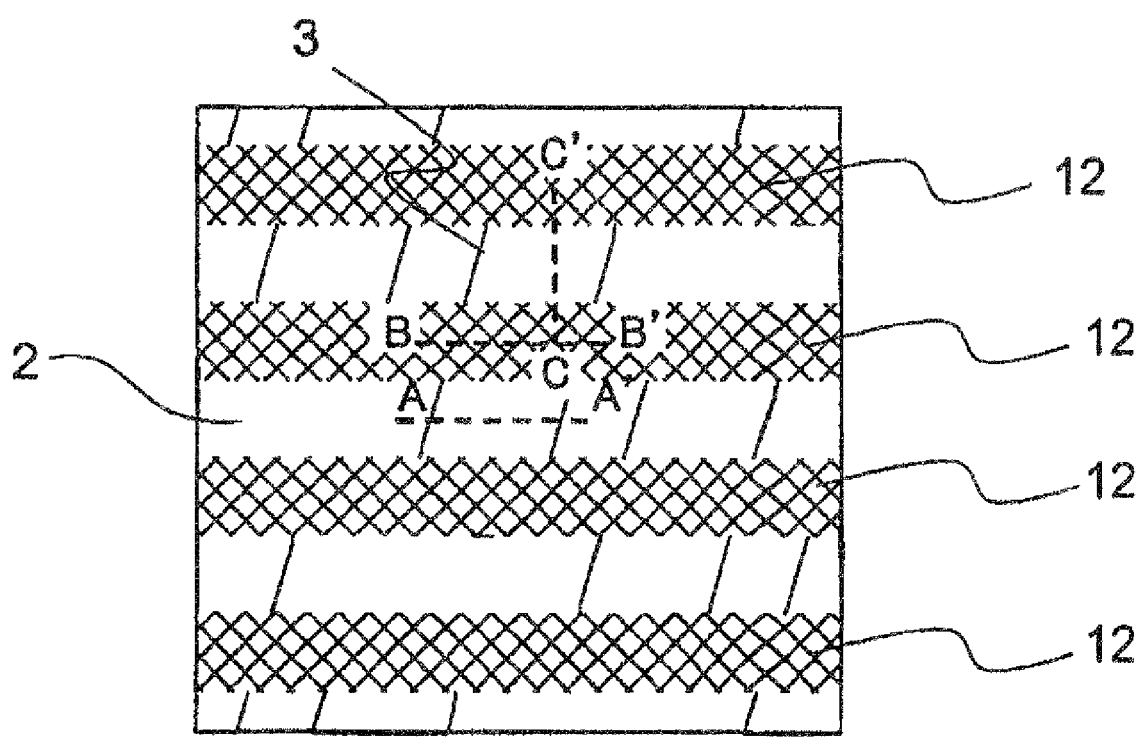
FIG. 6 is a plan view showing the state shown in FIG. 5.

Subsequently, photoresist 12 is formed over anti-reflective film 11 by spin coating, followed by exposure and development using a photomask having a reversed pattern of gate electrode 4 (word line). FIG. 6 is a plan view showing the state shown in FIG. 5. Since exposure and development are performed using the reversed pattern of gate electrode 4, a region which will not be formed with gate electrode 4 is covered with photoresist 12.

At this stage, the A-A' section is in a state in which the surface thereof is covered with anti-reflective film 11 as shown in FIG. 5. The B-B' section and the section of the peripheral circuit portion are each in a state in which the surface thereof is covered with anti-reflective film 11 and photoresist 12. The C-C' section is in a state in which a pattern corresponding to gate electrode 4 is formed in photoresist 12. By the use of the reversed pattern of gate electrode 4, width Ls and Ld of active regions 3 of source region 5 and drain region and 6 can be different from width Lg of active region 3 of a channel region under gate electrode 4, by a later step (see FIG. 9).

Figure 7:
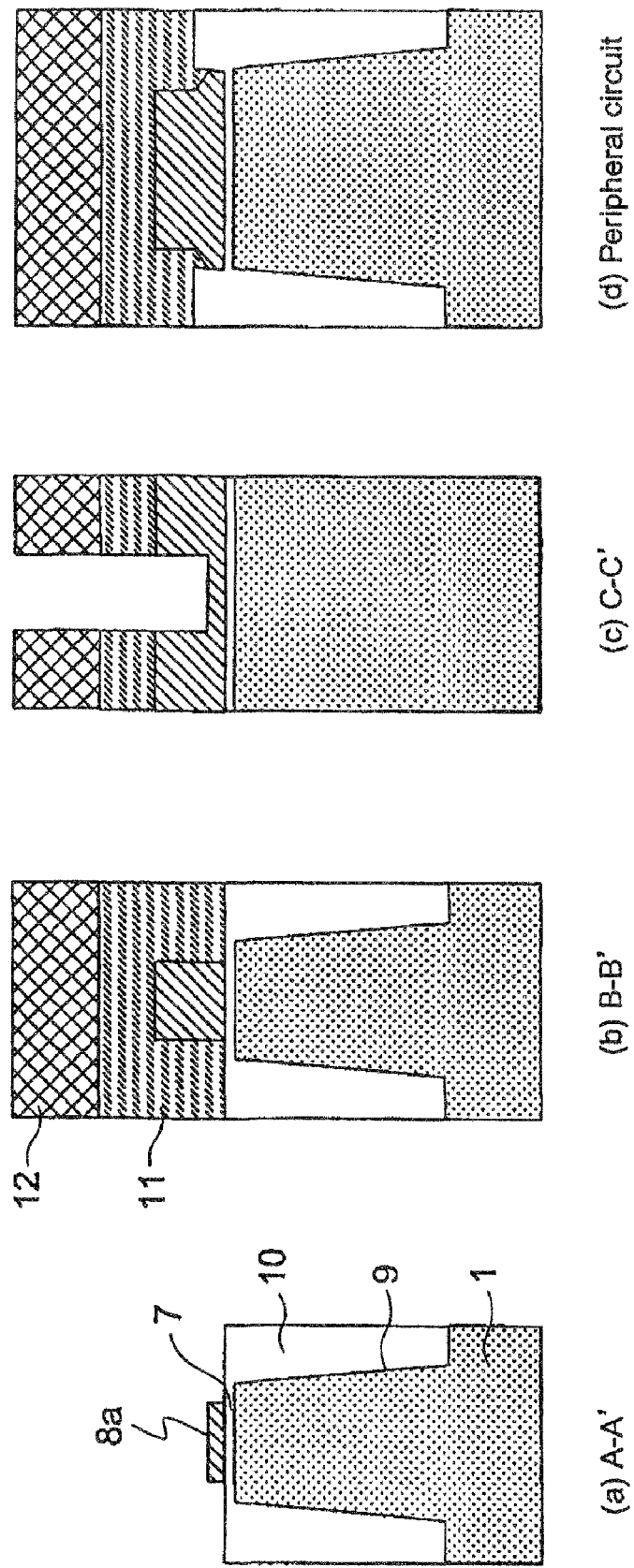
FIG. 7 includes sectional views showing a state resulting from dry etching of the anti-reflective film having a surface exposed in a region to be formed with a gate electrode.

Subsequently, as shown in FIG. 7, a portion of anti-reflective film 11 which has a surface exposed in a region to be formed with gate electrode 4 is subjected to dry etching using a fluorocarbon-type gas with photoresist 12 used as a mask. Narrowed mask layer 8a consisting of the silicon nitride film is also etched together with anti-reflective film 11 by the dry etching. As a result, narrowed mask layer 8a can partially remain with a thickness of about 20 nm in the A-A' section. At that time, the width of narrowed mask layer 8a is 50 nm, which remains unchanged. Mask layer 8 in the C-C' section is also etched partially.

Subsequently, as shown in FIG. 8, further dry etching using a fluorocarbon-type gas is performed to etch the oxide film by a thickness equal to the thickness of pad oxide film 7. By so doing, a surface of silicon substrate 1 in a region in which the gate trench (see FIG. 9) will be formed later is exposed in the A-A' section. At that time, the thickness of narrowed mask layer 8a is 10 nm, while the width thereof is 50 nm, which remains unchanged.

Figure 9:
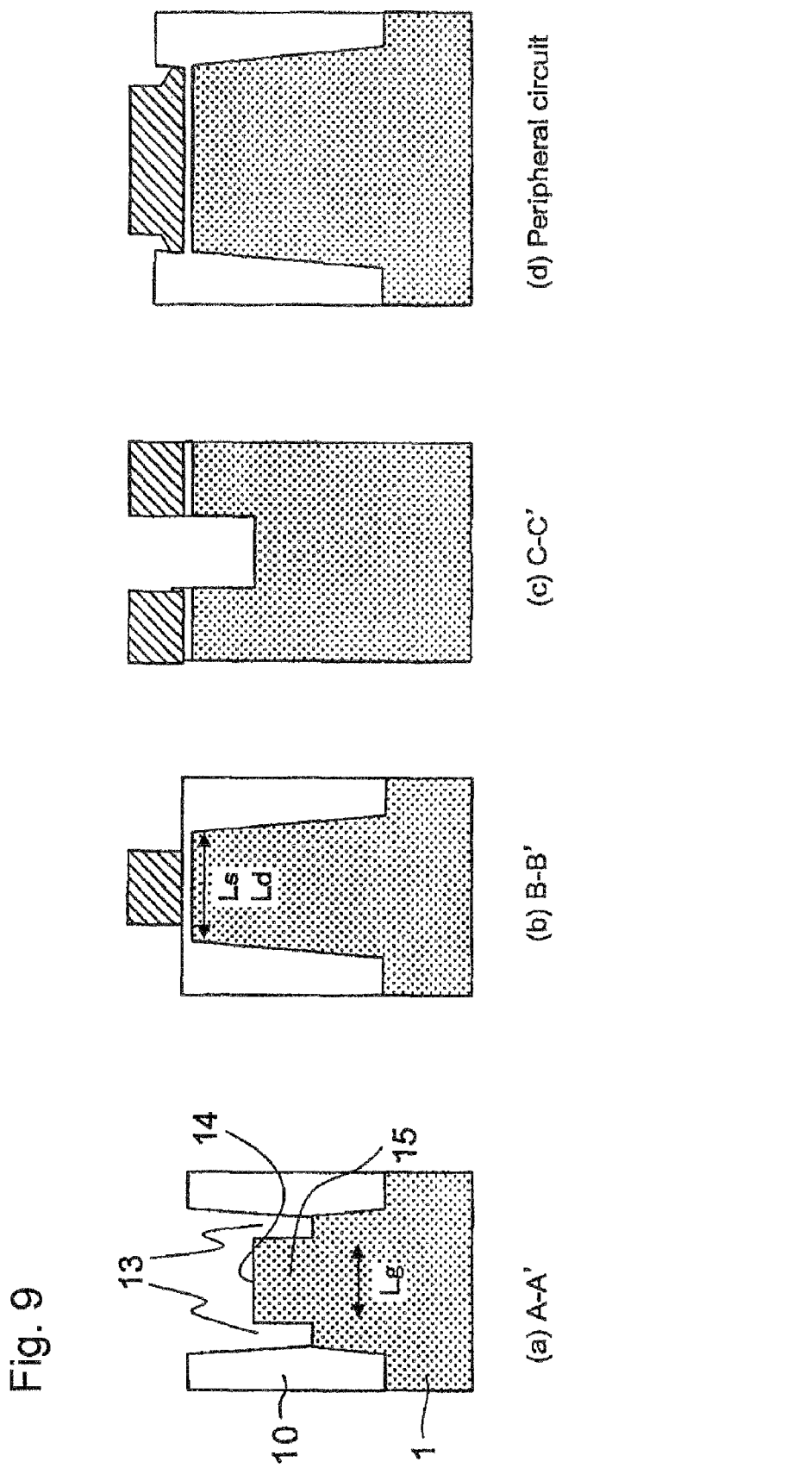
FIG. 9 includes sectional views showing a state resulting from formation of a gate trench with use of the narrowed mask layer, pad oxide film and STI insulating film as masks.

Subsequently, as shown in FIG. 9, the surface of silicon substrate 1 which is exposed in active region 3 is etched by dry etching using a chlorine-type gas with narrowed mask layer 8a, pad oxide film 7 and STI insulating film 10 used as masks.

As a result, gate trench 13 is formed. Then, photoresist 12 and anti-reflective film 11 are removed by oxygen ashing.

Since the total thickness of narrowed mask layer 8a and pad oxide film 7 is small, the etching step causes narrowed mask layer 8a and pad oxide film 7 to disappear during the formation of gate trench 13. As a result, a Fin shape is obtained in which top surface 14 of Fin channel 15 (i.e., Fin-shaped portion) is dented to a position lower than the surface of STI insulating film 10 as shown in the A-A' sectional view.

Assuming that the selective etching ratio between silicon and silicon nitride (and silicon oxide) is about 3.5 for example, STI insulating film 10 is etched down by 20 nm at the time pad oxide film 7 and narrowed mask layer 8a disappear. At that time, gate trench 13 is etched by about 70 nm from the surface of silicon substrate 1. When further etching is performed from this state until gate trench 13 has a depth of 150 nm from the surface of silicon substrate 1, STI insulating film 10 is etched down by about 55 nm from the surface of silicon substrate 1. As a result, Fin-shaped portion 15 has a height of 80 nm. In the C-C' section shown, a trench is formed having a bottom surface which forms top surface 14 of Fin-shaped portion 15.

Although steps which follow the above-described steps are not illustrated, narrowed mask layer 8a and pad oxide film 7 which remain on the surface are removed; a gate insulating film is formed on an exposed surface of silicon substrate 1; and gate electrode 4 is formed in such a manner as to fill up gate trench 13. Subsequently, silicon substrate 1 is subjected to impurity ion implantation using gate electrode 4 as a mask to form source region 5 and drain region 6. After that, an interlayer insulating film is formed over the entire surface and contact holes are formed in source region 5 and drain region 6. Further, the contact holes are filled with a conductor such as polycrystalline silicon to form contact plugs which are connected to a bit line forming an upper layer and to a capacitive element.

The method of manufacturing a semiconductor device according to the present exemplary embodiment is capable of forming Fin-shaped portion 15 by narrowing mask layer 8 used in the formation of STI region 2 to form narrowed mask layer 8a and by further forming gate trench 13 to a position lower than gate electrode 4 in active region 3 by using a mask having the reversed pattern of gate electrode 4. Therefore, it is possible to form a transistor having a fine Fin channel which is equivalent to or finer than the resolution limit of lithography, with width Lg of Fin-shaped portion 15 being narrower than the initial width of active region 3. Further, since width Ls of source region 5 and width Ld of drain region 6 are each kept equal to the initial width of active region 3, a reduction in the areas of top surfaces of source region 5 and drain region 6 can be avoided. Thus, it is possible to prevent the contact resistance from increasing.

Second Exemplary Embodiment

A method of manufacturing a semiconductor device according to a second exemplary embodiment will be described with reference to FIGS. 10 to 26. The manufacturing method according to the present exemplary embodiment performs the same steps as those illustrated in FIGS. 2 to 4 of the method of manufacturing a semiconductor device according to the first exemplary embodiment and then performs steps illustrated in FIGS. 10 to 26. Initially, STI insulating film 10 surrounding active region 3 is formed and then narrowed mask layer 8a consisting of a silicon nitride film is formed on active region 3 via intervening pad oxide film 7 by the steps illustrated in FIGS. 2 to 4. Conditions including film thicknesses are similar to those employed in the first exemplary embodiment.

Figure 10:
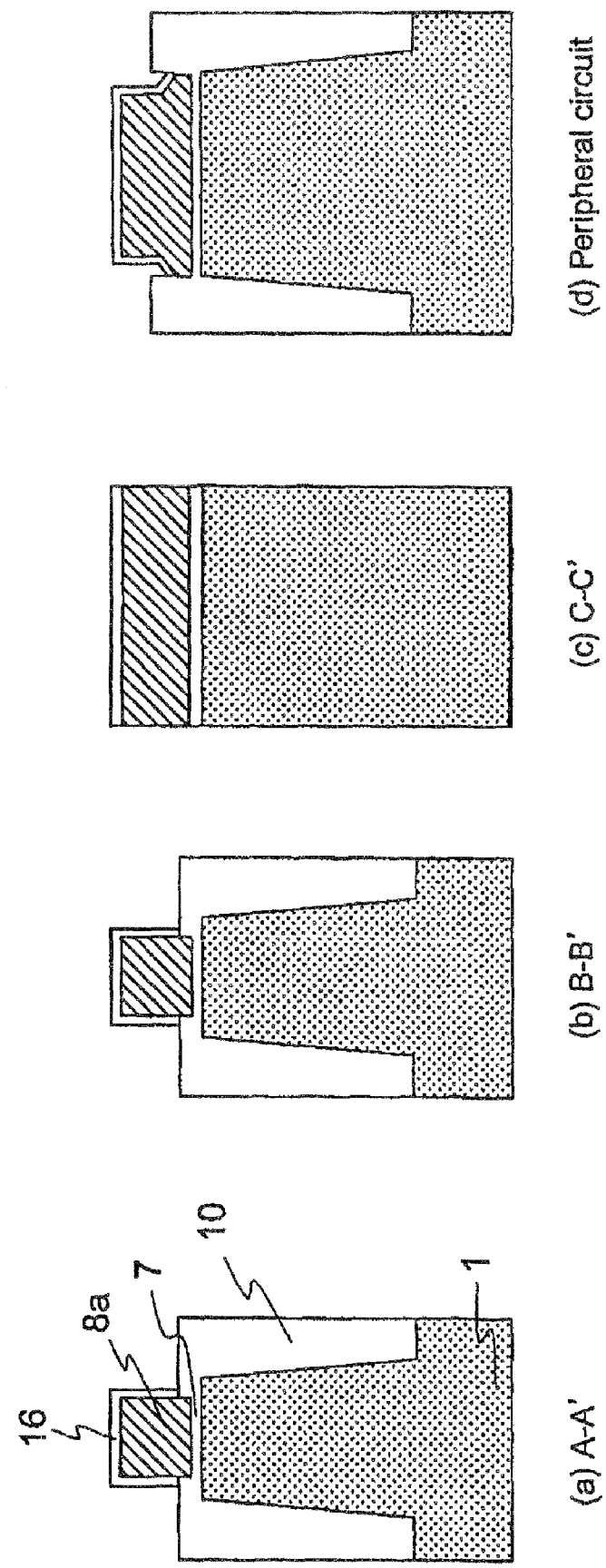
FIG. 10 includes sectional views showing a state resulting from formation of a stopper oxide film by CVD on the structure in the state shown in FIG. 4.

Subsequently, as shown in FIG. 10, stopper oxide film 16 consisting of a silicon oxide film serving as a stopper is formed by CVD. Stopper oxide film 16 functions as a stopper during formation of a pattern by lithography and dry etching on polysilicon 17 which is deposited on stopper oxide film 16 in a later step (see FIG. 11). Stopper oxide film 16 has a thickness of several nanometers (5 nm in this exemplary embodiment), which is sufficient because dry etching can maintain sufficient selectivity between polysilicon and oxide film. Stopper oxide film 16 may be formed by thermal oxidation.

Figure 11:
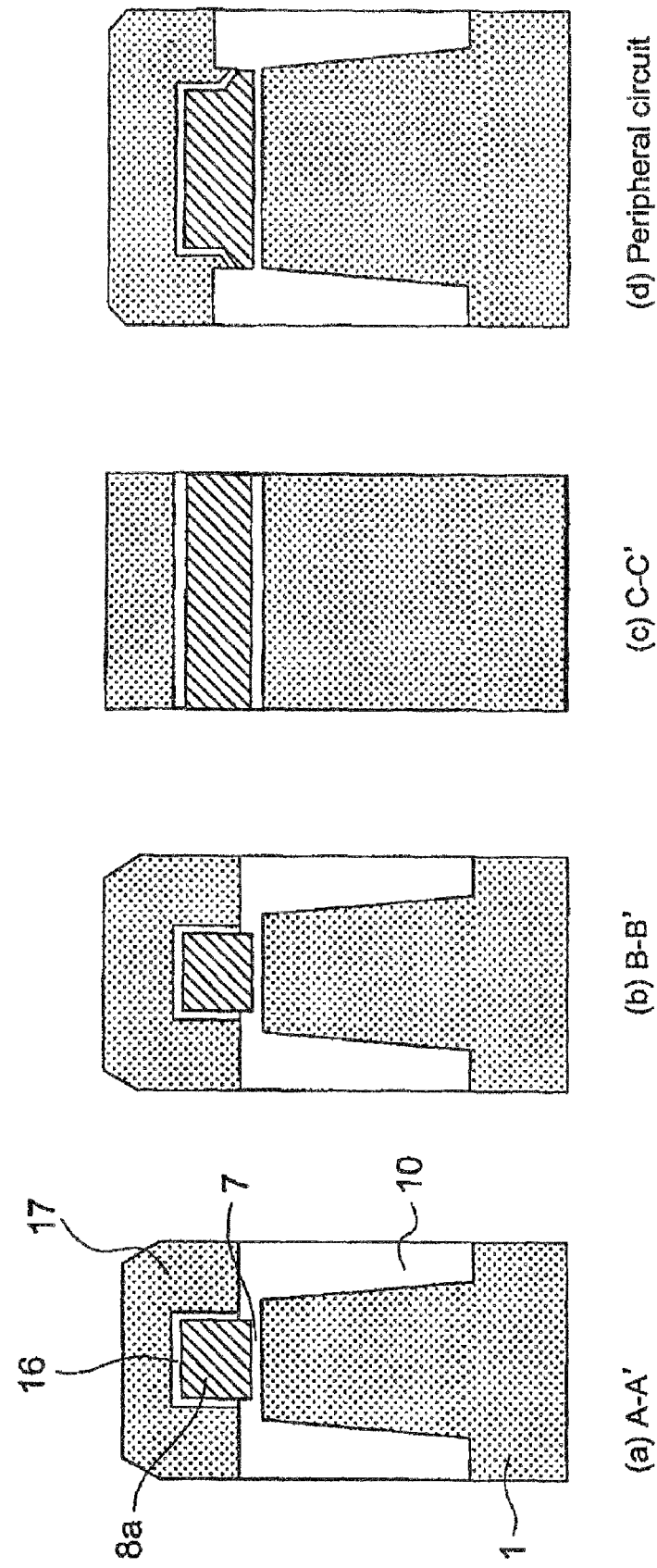
FIG. 11 includes sectional views showing a state resulting from deposition of polysilicon over the entire surface by CVD.
Figure 12:
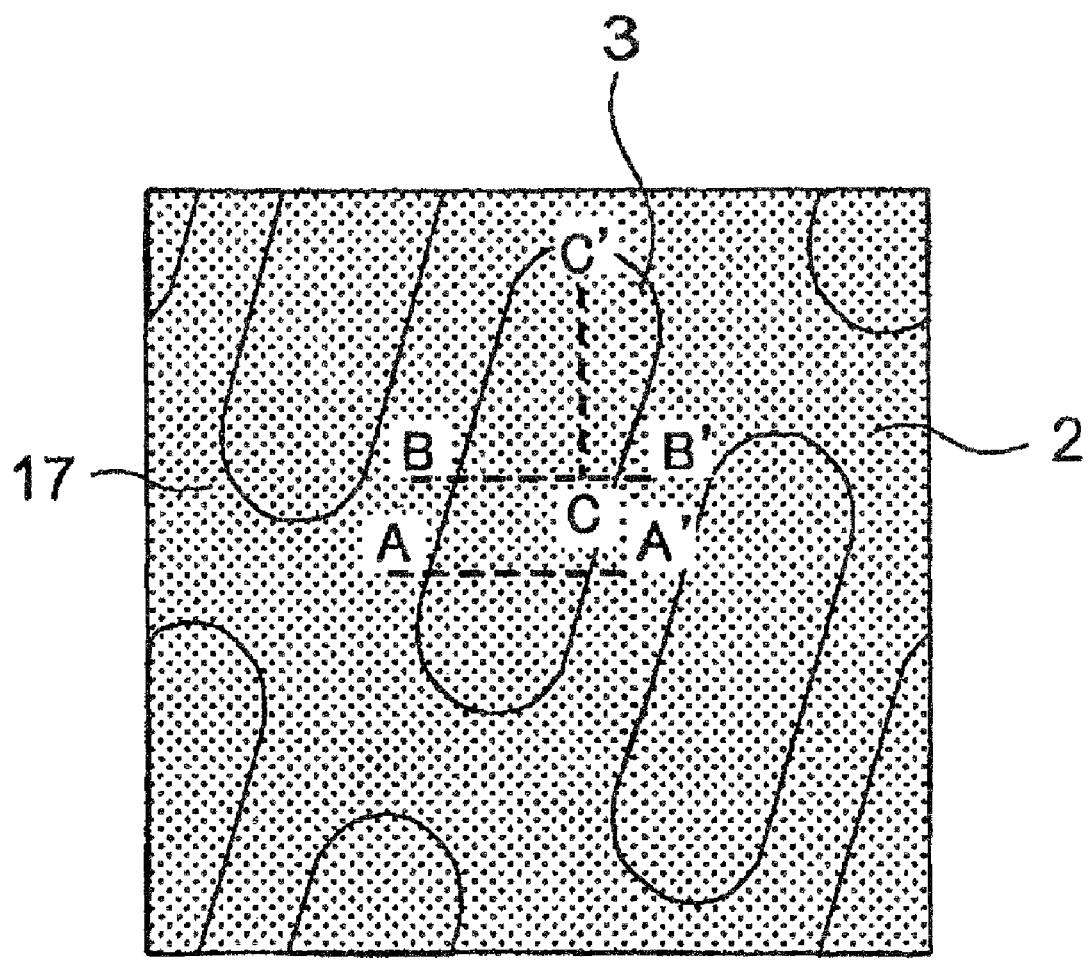
FIG. 12 is a plan view showing the state shown in FIG. 11.

Subsequently, as shown in FIG. 11, polysilicon 17 is deposited over the entire surface by CVD. In this step, polysilicon 17 is deposited to such a film thickness as to fill up STI region 2 for making the entire surface substantially flat and allow removal thereof by dry etching for formation of a gate trench in a later step. Stated otherwise, the film thickness of polysilicon 17 is such that the height of the surface resulting from the deposition of polysilicon 17 from a top surface of STI insulating film 10 in a state before the deposition of polysilicon 17 is smaller than the depth of the gate trench (see FIG. 18). Such a film thickness is typically 100 nm.

The entire surface is made substantially flat by the deposition of polysilicon 17 because, unless it is done so, narrowed mask layer 8a is undesirably etched, which makes it difficult to form a Fin-shaped portion having a desired height. That is, polysilicon 17 has the function of protecting stopper oxide film 16 and narrowed mask layer 8a during etching of an anti-reflective film (see FIG. 13).

Figure 14:
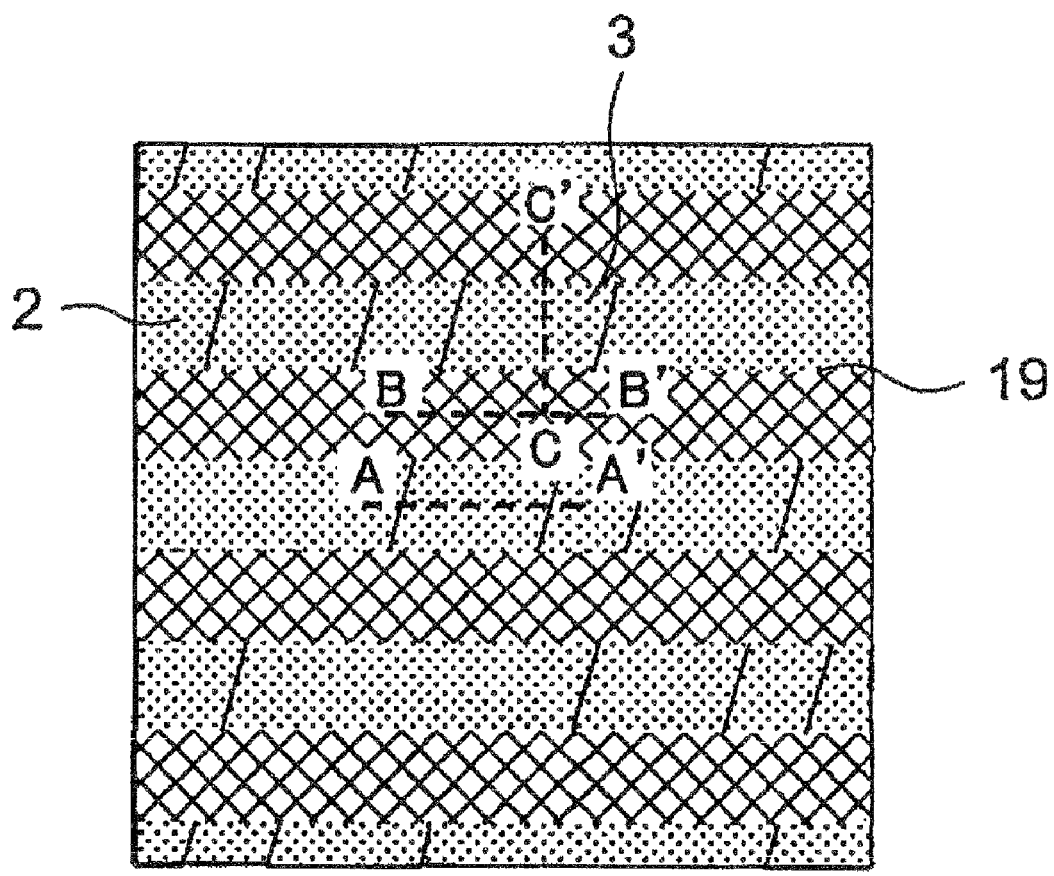
FIG. 14 is a plan view showing the state shown in FIG. 13.

Subsequently, as shown in FIG. 13, anti-reflective film 18 and photoresist 19 are coated, and then exposure and development are performed using a reticle (also called "mask") having a reversed pattern of gate electrode 4 (word line). FIG. 14 is a plan view showing a state at this stage. By performing the exposure and development using the mask having such a reversed pattern, the finished width of active region 3 forming each of source region 5 and drain region 6 can be different from the width of active region 3 forming a region extending under gate electrode 4. By so doing, the contact resistances of source region 5 and drain region 6 can be lowered as compared with a case where no difference is made in finished width.

Figure 15:
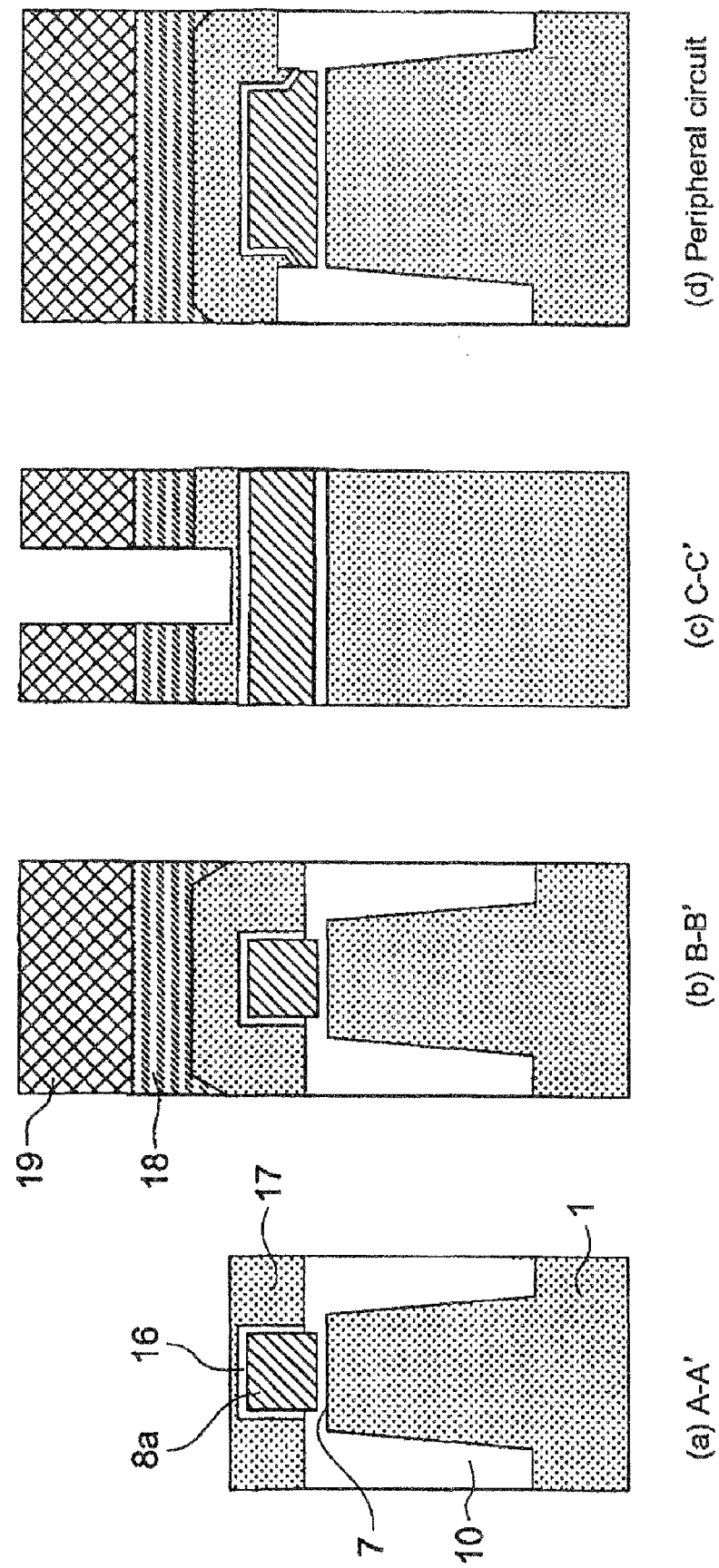
FIG. 15 includes sectional views showing a state resulting from anisotropic dry etching of the anti-reflective film with use of photoresist as a mask.

Subsequently, as shown in FIG. 15, anti-reflective film 18 is subjected to anisotropic dry etching using a fluorocarbon-type gas with photoresist 19 used as a mask. In this step, narrowed mask layer 8a consisting of the silicon nitride film is covered with polysilicon 17 unlike the state shown in FIG. 7 according to the first exemplary embodiment and, hence, narrowed mask layer 8a, which will serve as a mask in the formation of the gate trench, is allowed to remain unetched during etching of anti-reflective film 18.

Figure 16:
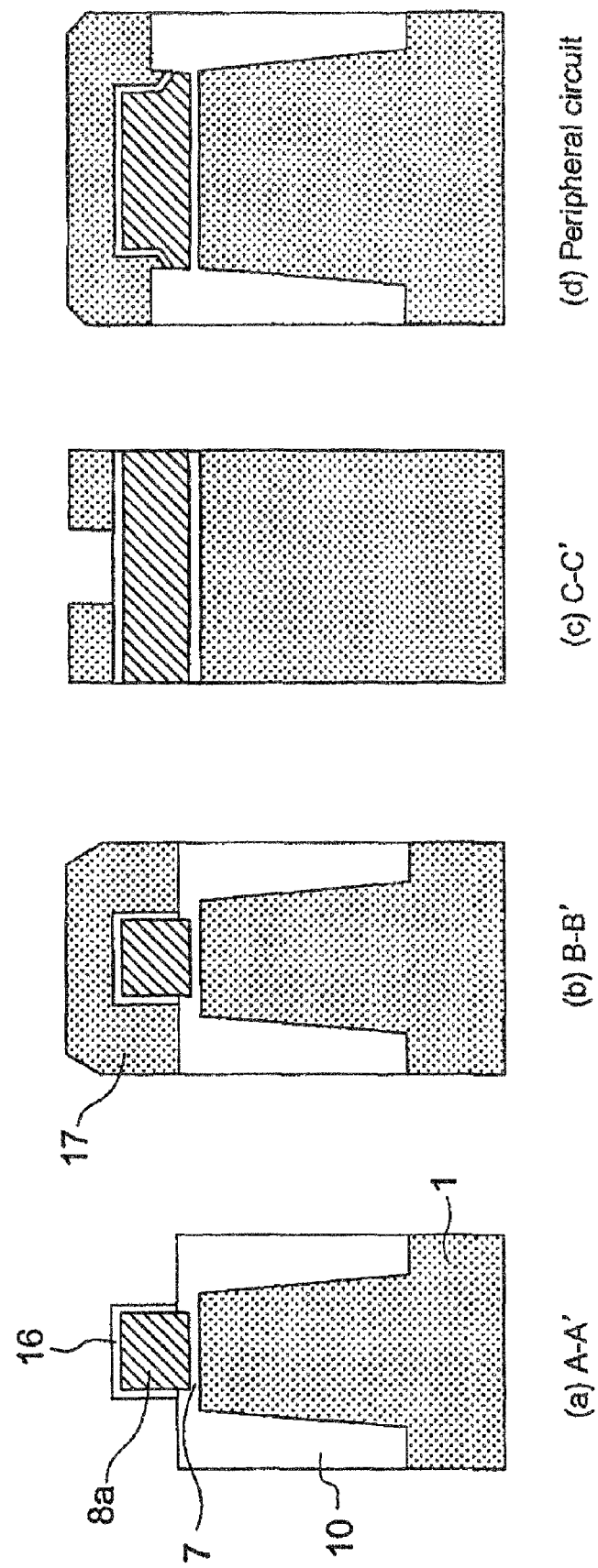
FIG. 16 includes sectional views showing a state resulting from dry etching of polysilicon with use of the photoresist as a mask.

Subsequently, as shown in FIG. 16, polysilicon 17 is dry etched using a chlorine-type gas with photoresist 19 used as a mask to expose stopper oxide film 16 in the A-A' and C-C' sections. Further, anti-reflective film 18 and photoresist 19 are peeled off using an organic acid or the like.

Figure 17:
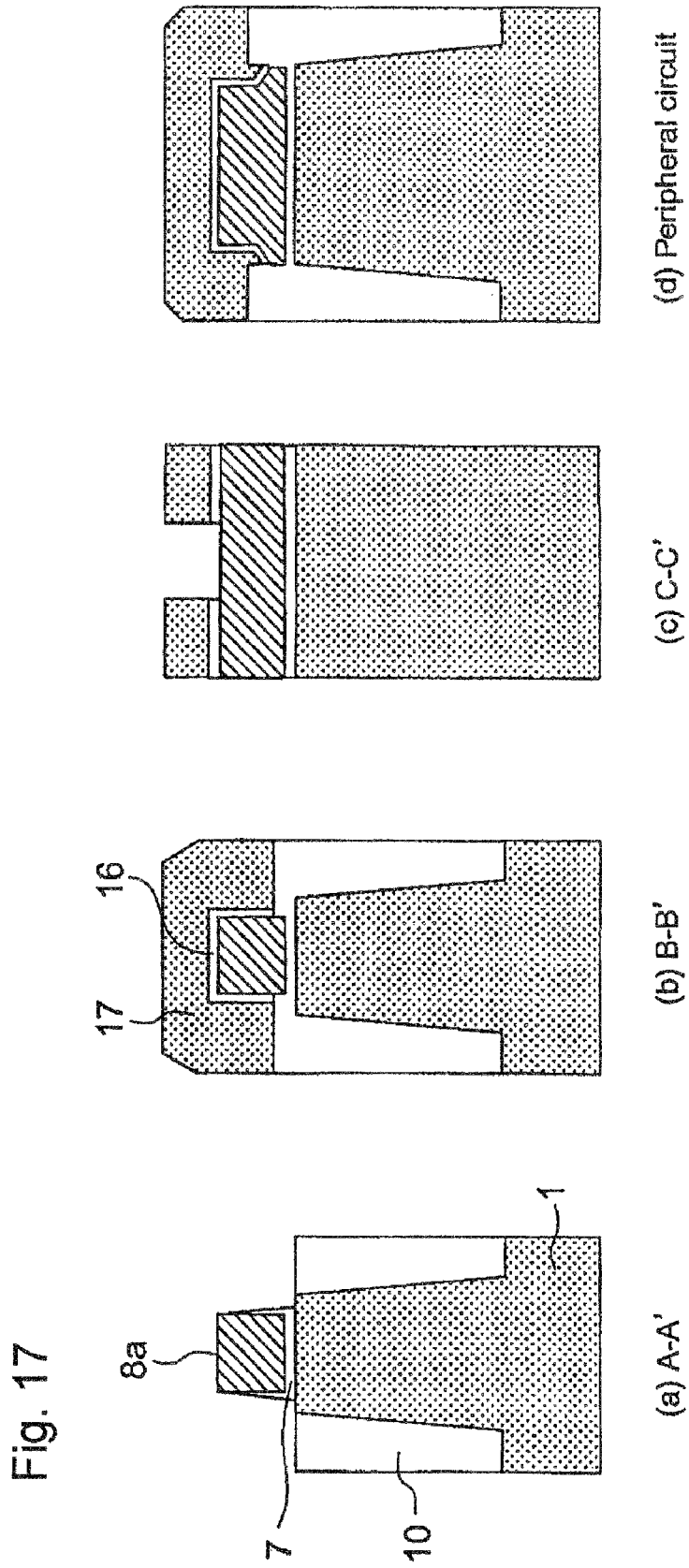
FIG. 17 includes sectional views showing a state resulting from dry etching of the stopper oxide film.

Subsequently, as shown in FIG. 17, stopper oxide film 16 is etched by about 10 nm by time-specified dry etching using a fluorocarbon-type gas. By this etching, STI insulating film 10 and a portion of the top surface of silicon substrate 1 which adjoins narrowed mask layer 8a via intervening pad oxide film 7 are exposed in the A-A' section.

Figure 18:
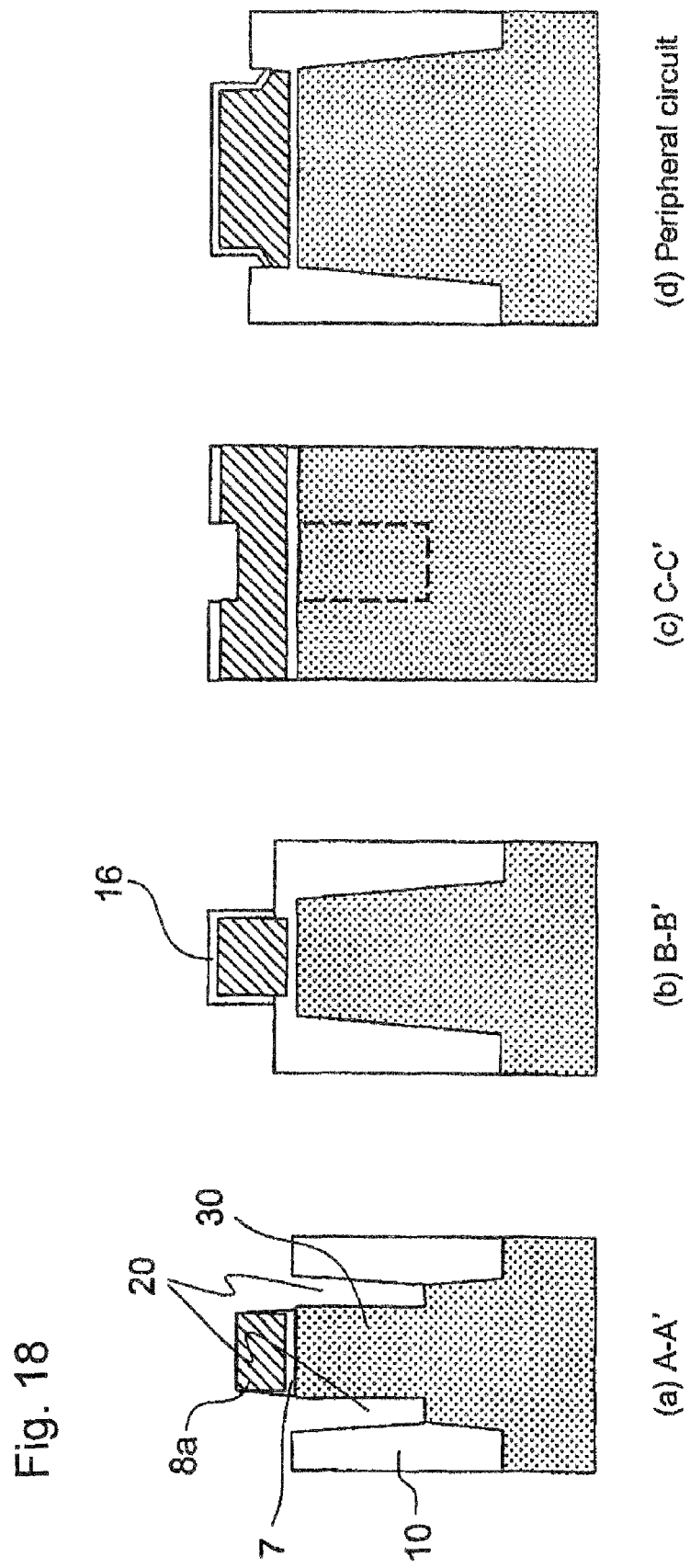
FIG. 18 includes sectional views showing a state resulting from formation of a gate trench with use of the narrowed mask layer, stopper oxide film and polysilicon as masks.

Subsequently, as shown in FIG. 18, silicon substrate 1 is etched by time-specified anisotropic dry etching using a chlorine-type gas to form gate trench 20 in the A-A' section. A broken line in the C-C' sectional view intends to depict gate trench 20 located on the reverse side opposite away from this section in a see-through fashion. The same holds true for a broken line in each of C-C' sectional views illustrating respective of steps which follow this step. By this etching, silicon substrate 1 is formed with Fin-shaped portion 30 in the A-A' section which will form a channel region of a transistor. In other sections, polysilicon 17 is etched away. A typical depth of gate trench 20, i.e., a height of Fin-shaped portion 30, is 150 nm.

Figure 19:
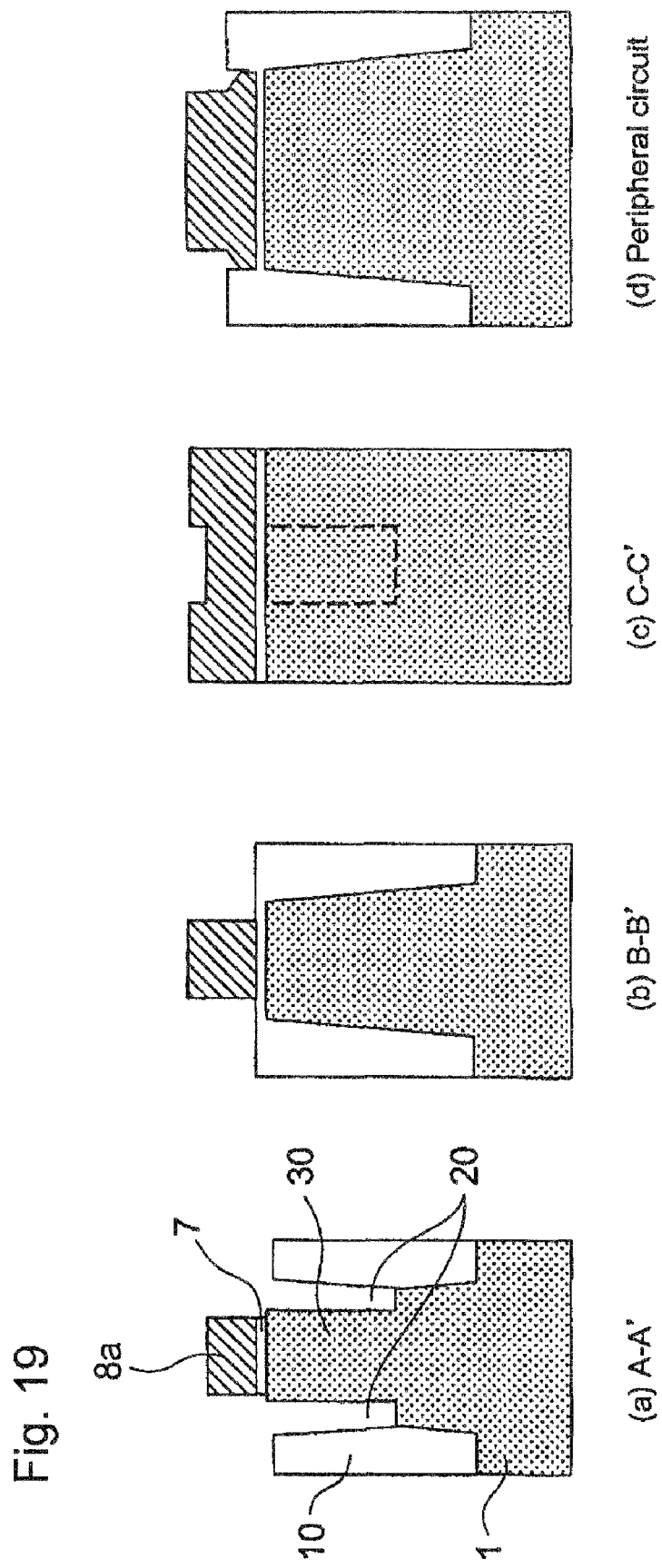
FIG. 19 includes sectional views showing a state resulting from removal of the stopper oxide film on the narrowed mask layer.

Subsequently, as shown in FIG. 19, time-specified wet etching using hydrofluoric acid or the like is performed to remove stopper oxide film 16 on narrowed mask layer 8a shown in the B-B' sectional view of FIG. 18.

Figure 20:
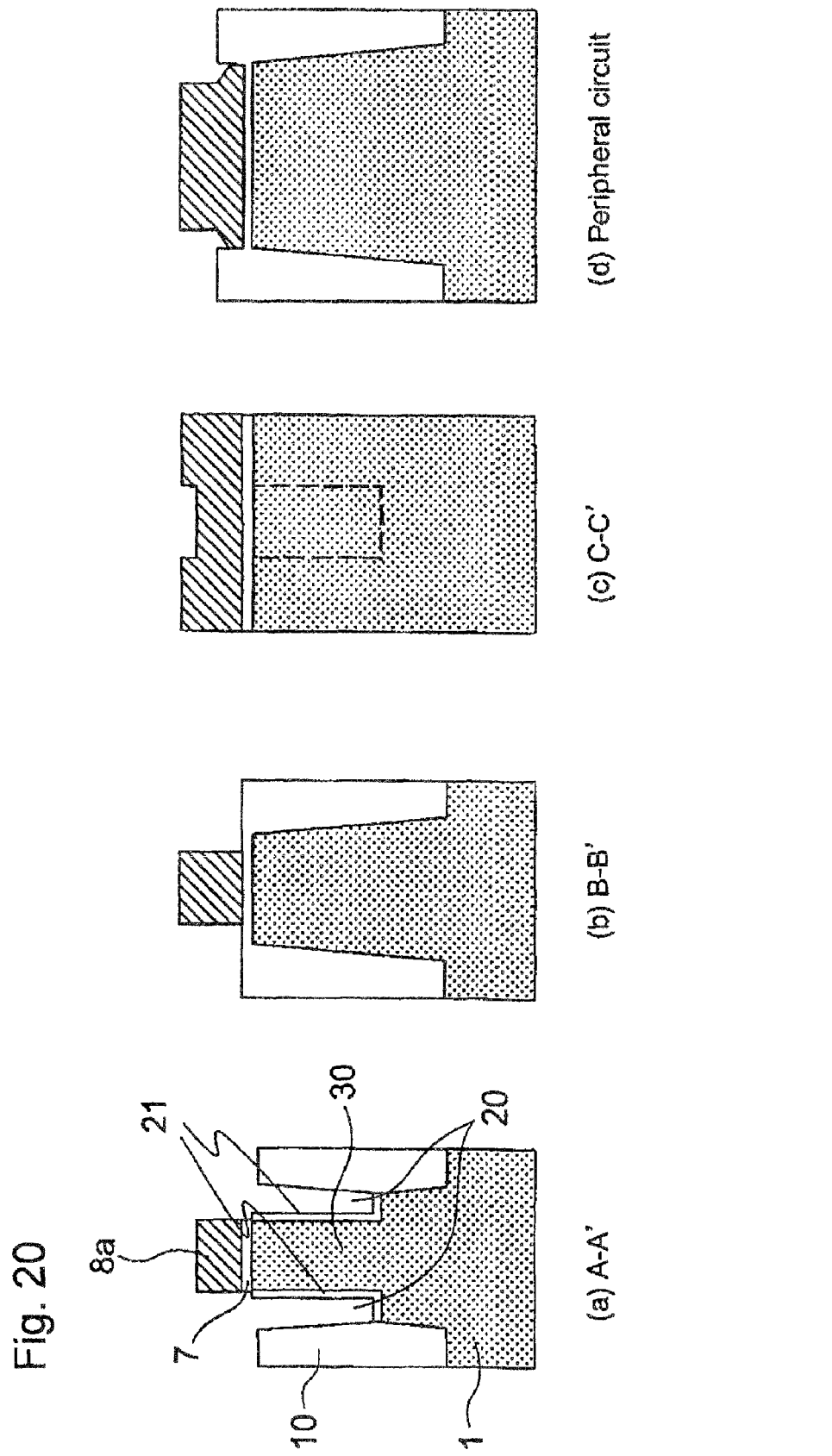
FIG. 20 includes sectional views showing a state resulting from formation of a silicon oxide film covering a silicon surface.

Subsequently, as shown in FIG. 20, a silicon surface exposed by dry etching is covered with silicon oxide film 21 by thermal oxidation in order to protect the silicon surface during removal of the silicon nitride film (narrowed mask layer 8a) by using a phosphoric acid in a later step (see FIG. 21).

Since wet etching using the phosphoric acid offers a sufficiently high selective ratio between silicon nitride and silicon oxide, it is sufficient that the thickness of silicon oxide film 21 formed by thermal oxidation is about 5 nm. This step makes it possible to adjust the width of Fin-shaped portion 30.

Figure 21:
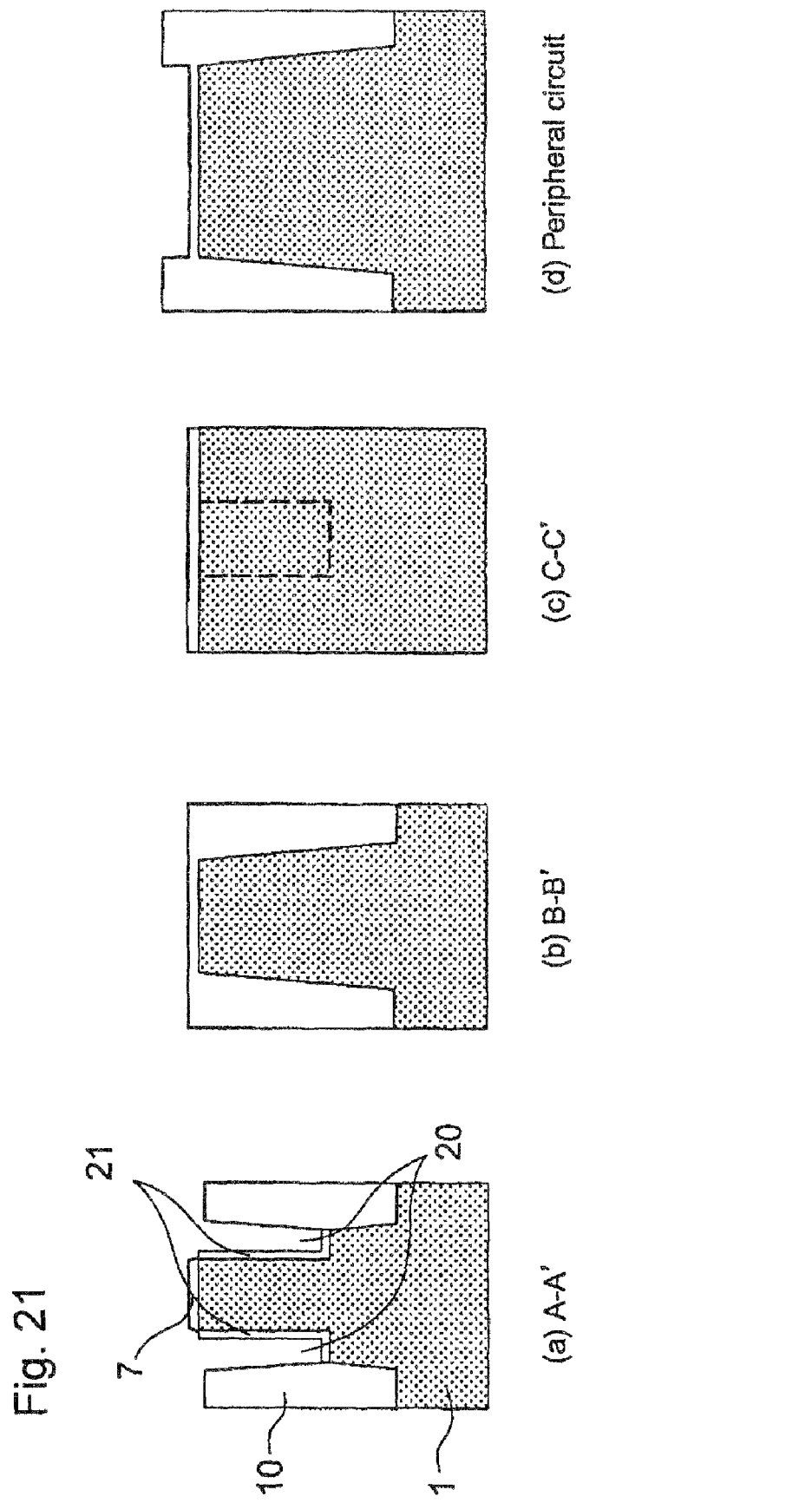
FIG. 21 includes sectional views showing a state resulting from removal of the narrowed mask layer.

Subsequently, as shown in FIG. 21, time-specified wet etching using a phosphoric acid at 160° C. is performed to remove narrowed mask layer 8a comprising the above-described silicon nitride film. Thereafter, impurities, including an impurity for formation of a well diffusion layer and a channel impurity for adjustment of a transistor's threshold voltage, are introduced into silicon substrate 1 by ion implantation.

Figure 22:
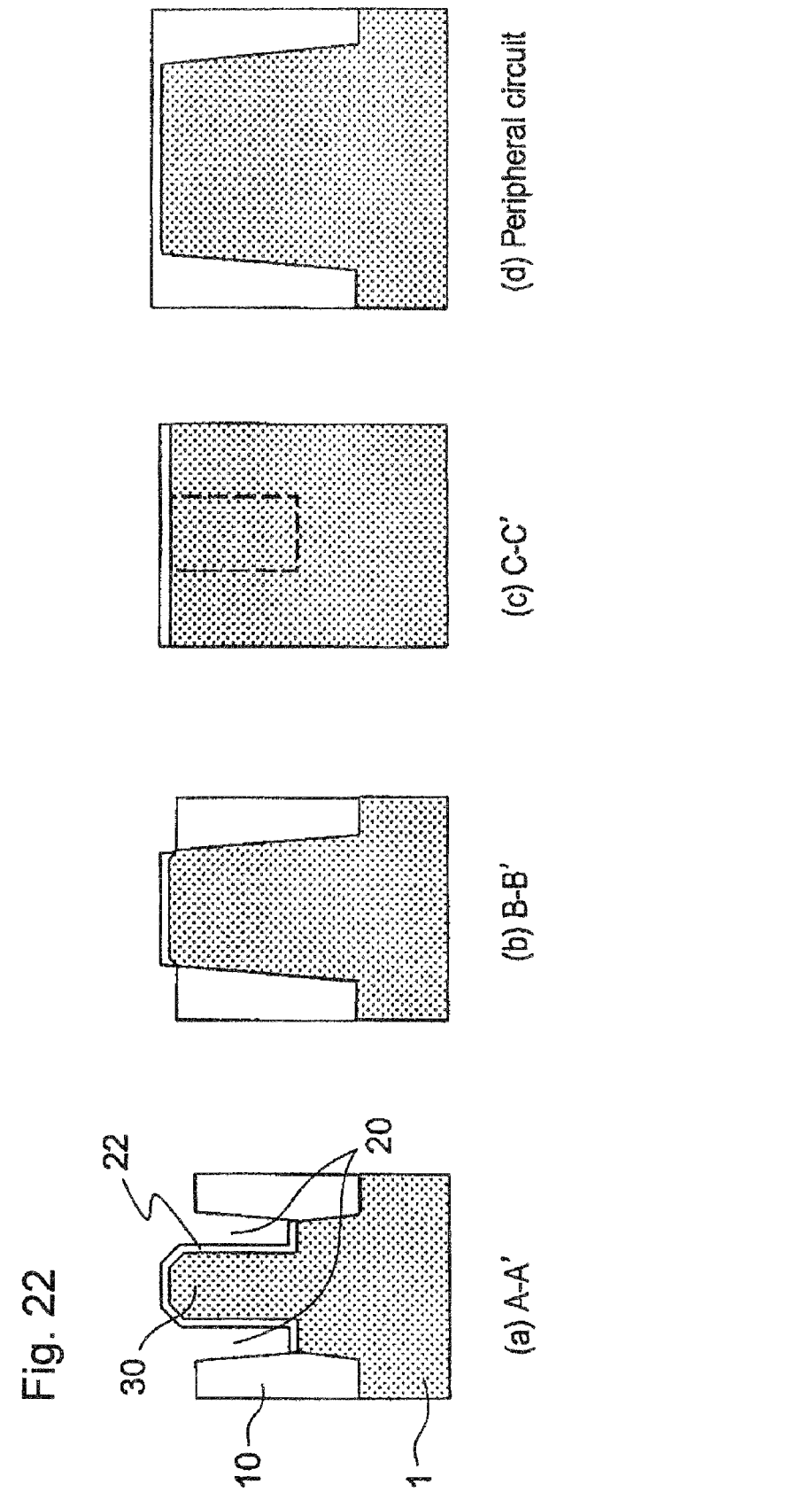
FIG. 22 includes sectional views showing a state resulting from formation of a gate insulating film after removal of the pad oxide film and the silicon oxide film.
Figure 23:
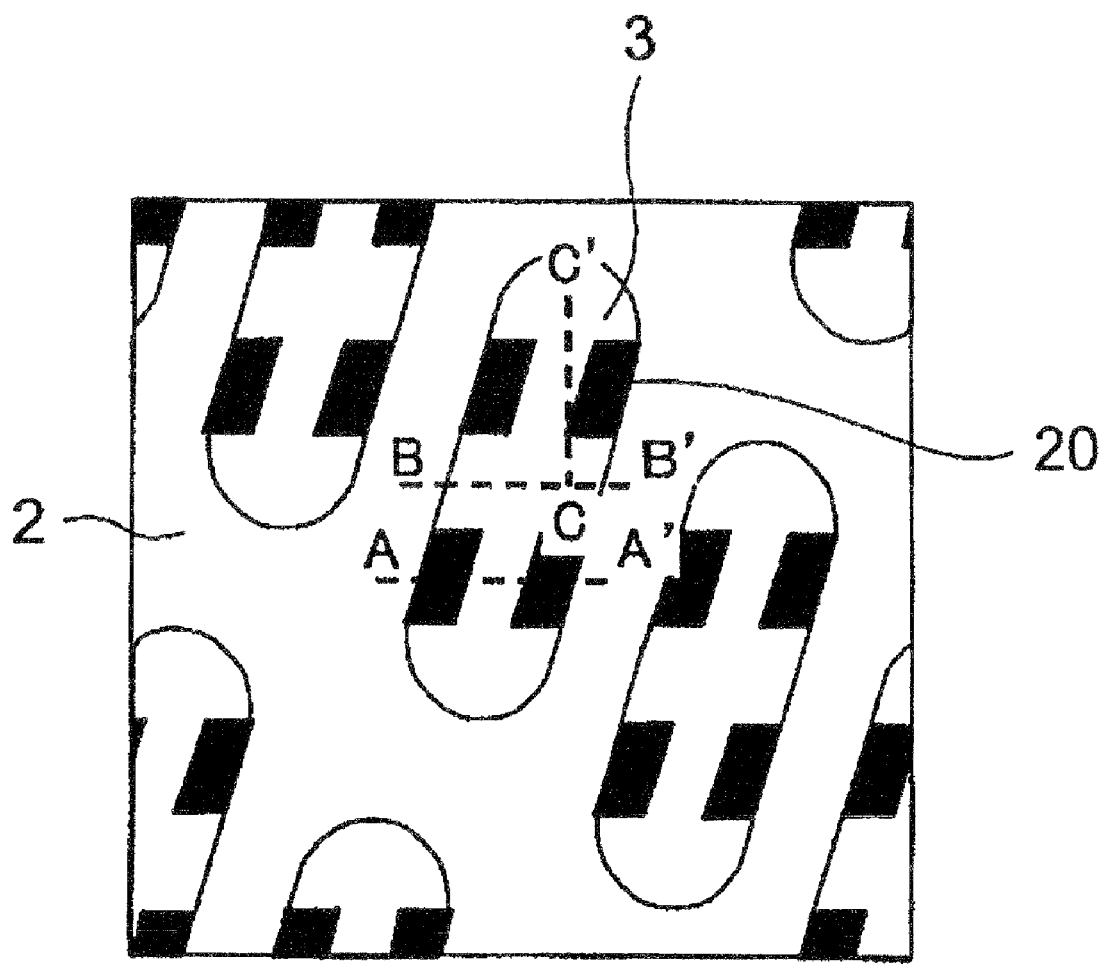
FIG. 23 is a plan view showing the state shown in FIG. 22.

Subsequently, as shown in FIG. 22, time-specified wet etching using hydrofluoric acid or the like is performed to remove pad oxide film 7 and silicon oxide film 21 on a surface of silicon substrate 1. Thereafter, gate insulating film 22 is formed by performing thermal oxidation or a like process again. FIG. 23 is a plan view showing a state at this stage in which portions shown in black corresponds to gate trenches 20.

Figure 24:
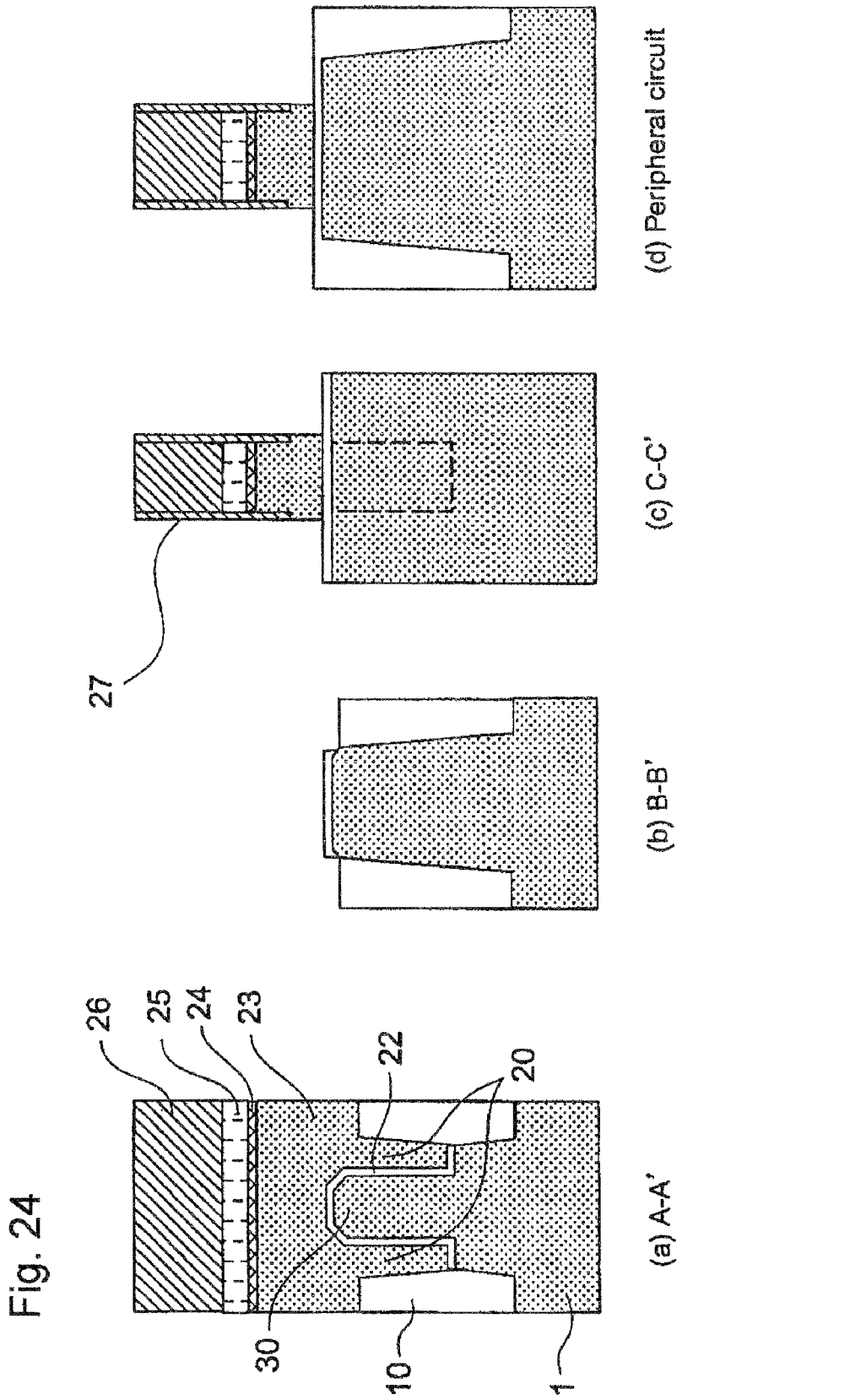
FIG. 24 includes sectional views showing a state resulting from formation of a gate electrode.

Subsequently, as shown in FIG. 24, gate electrode 4 (word line) is formed. First, polysilicon film 23 is deposited over the entire surface so as to fill up gate trench 20. Then, tungsten nitride film 24, tungsten film 25 and silicon nitride film 26 are laminated in this order by deposition. Thereafter, patterning is performed by photolithography and dry etching to form gate electrode 4 (word line). Sidewall silicon nitride film 27 is formed halfway through the formation of gate electrode 4 in order to prevent tungsten from scattering from tungsten nitride film 24 and tungsten film 25, as shown in the C-C' sectional view and in the sectional view of the peripheral circuit portion.

Figure 25:
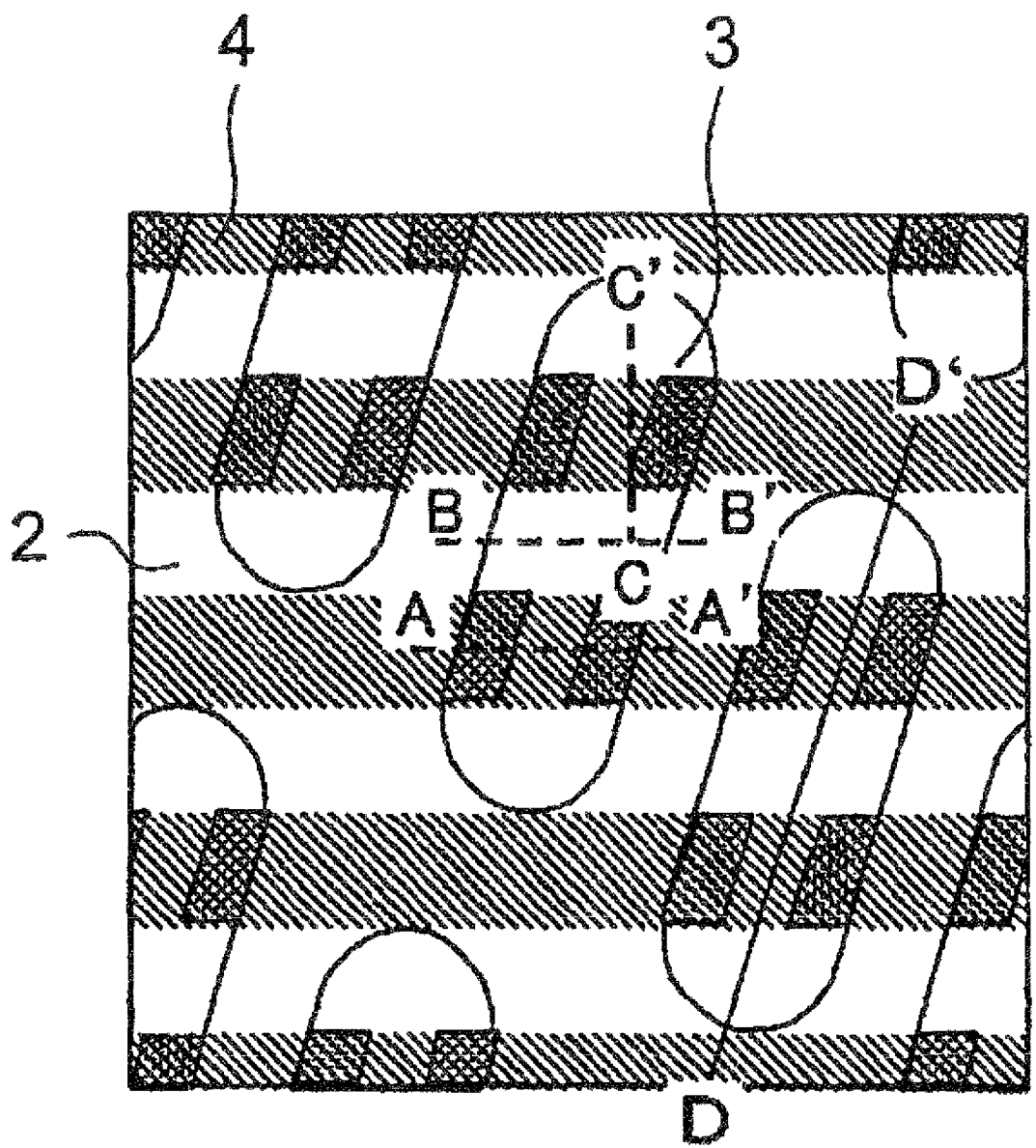
FIG. 25 is a plan view showing the state shown in FIG. 24.

FIG. 25 is a schematic plan view showing a state at the stage illustrated in FIG. 24. The manufacturing method including the above-described steps is capable of maintaining the widths of active regions 3 which will form source region 5 and drain region 6 to be formed with contacts while narrowing the width of active region 3 which will form a channel region under gate electrode 4. As a result, an increase in contact resistance can be suppressed.

Figure 26:
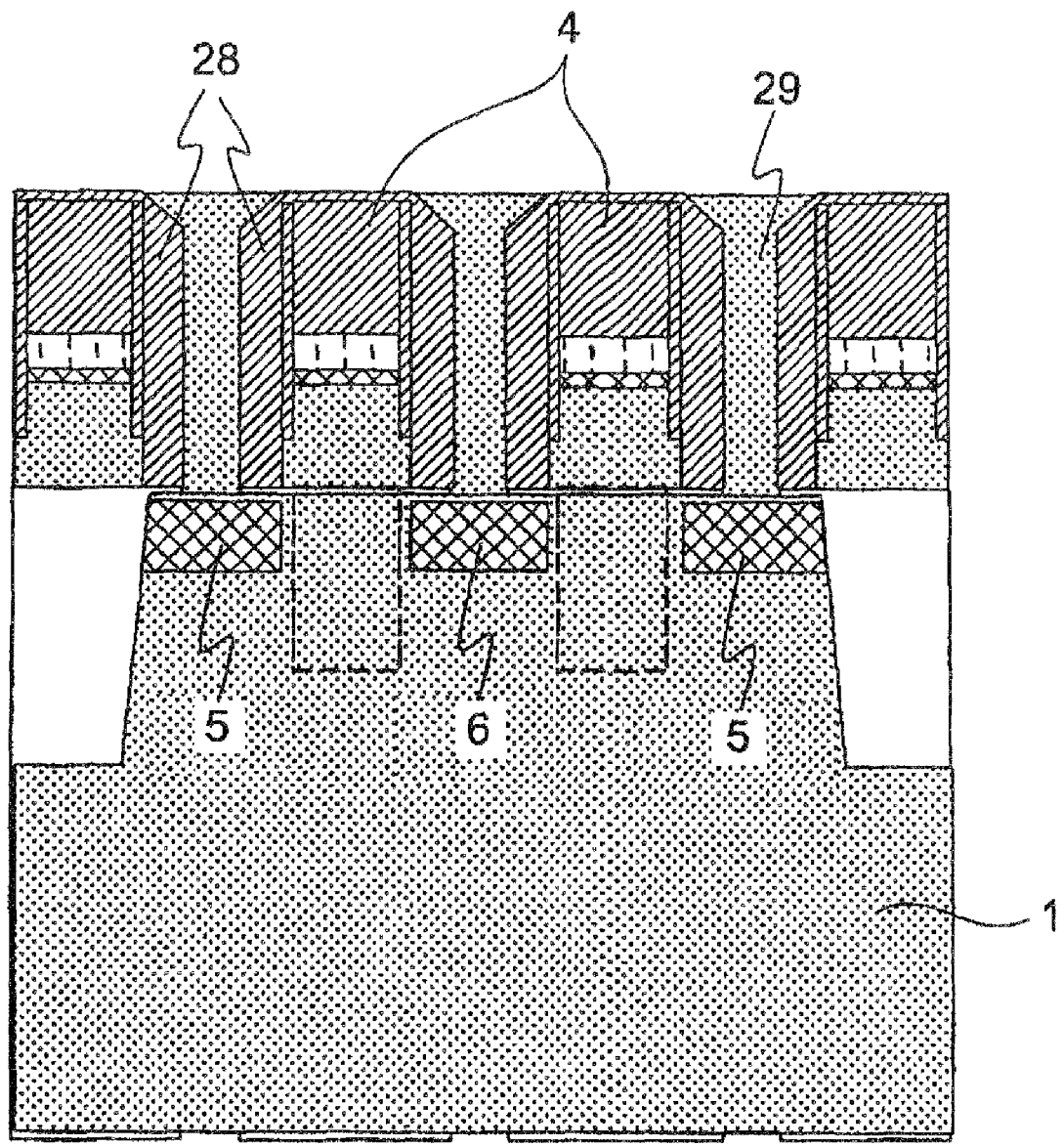
FIG. 26 is a sectional view taken on line D-D' in the plan view of FIG. 25.
Figure 27:
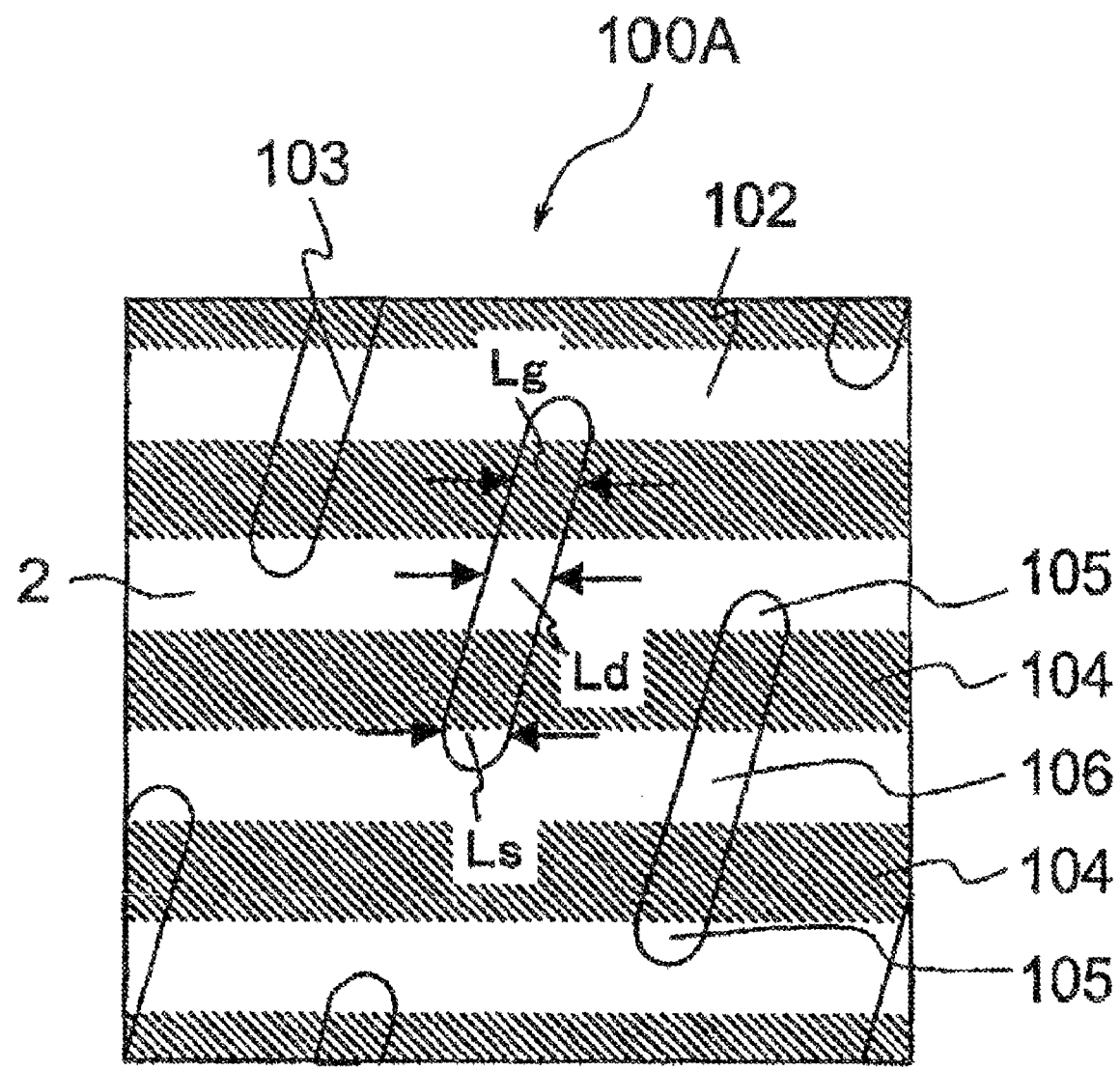
FIG. 27 is a view showing one exemplary plane layout of a conventional memory cell array.

FIG. 26 is a sectional view taken on line D-D' in the plan view of FIG. 25. After the step illustrated in FIG. 24, ion implantation is performed on silicon substrate 1 with use of gate electrode 4 as a mask, followed by a thermal treatment, to form source region 5 and drain region 6. Subsequently, sidewall 28 is formed on the sidewall of gate electrode 4. Further, an interlayer insulating film is formed, followed by formation of contact holes by photolithography and dry etching. Then, contact holes are filled up with a conductor to form contact plugs 29. In applying this transistor structure to memory cell array 100 of DRAM, contact plug 29 on source region 5 is connected to a capacitative element and contact plug 29 on drain region 6 is connected to a bit line.

The method of manufacturing a semiconductor device according to the present exemplary embodiment is capable of preventing narrowed mask layer 8a from being etched because anti-reflective film 18 is removed after narrowed mask layer 8a to be used as a mask in the formation of gate trench 20 has been provisionally covered with polysilicon. Therefore, narrowed mask layer 8a has a sufficient masking ability to allow deep gate trench 20 to be formed, thus making it possible to form a channel region having high Fin-shaped portion 30. As a result, the sectional area of the channel can be increased to suppress the short channel effect. Thus, it is possible to manufacture a transistor which has an excellent ON-OFF property and which is capable of supplying larger current.

While description has been made of the cases where the process for forming Fin-shaped portion 15 or 30 is applied to a memory device, this may be applied to a logic device similarly.

The method of manufacturing a semiconductor device and the semiconductor device according to an exemplary aspect of the invention may have the following embodiments. One embodiment has forming an anti-reflective film covering a substrate surface including the narrowed film pattern; and etching the anti-reflective film with use of the reversed pattern as an etching mask, in an order described and between the step of narrowing the width of the film pattern and the step of forming the Fin channel and the gate trench. In this case, the Fin channel can be formed using the narrowed film pattern as a mask, though the narrowed film pattern has a reduced thickness.

Another embodiment has protecting the narrowed film pattern with a stopper film; depositing a polysilicon film over an entire surface including the stopper film; etching the polysilicon film with use of the reversed pattern as an etching mask; and removing the stopper film, in an order described and between the step of narrowing the width of the film pattern and the step of forming the Fin channel and the gate trench. According to this embodiment, a hard mask for fabrication has a laminated structure consisting of polysilicon/stopper film (oxide film)/film pattern (nitride film) and, hence, polysilicon protects the film pattern. As a result, the shape of the film pattern is not impaired, so that the Fin channel can be formed with precision.

Another embodiment further has performing impurity ion implantation with use of the gate electrode as a mask to form source and drain regions. Thus, the width of an active region forming each of the source and drain regions can be different from the width of an active region forming the gate region.

In another embodiment, the width of the Fin channel is shorter than a gate length. This embodiment can suppress the short channel effect.

While an exemplary aspect of the invention has been described based on the exemplary embodiments, the method of manufacturing a semiconductor device and the semiconductor device according to an exemplary aspect of the invention are not limited to the arrangements of the foregoing exemplary embodiments. Various modifications and changes from the arrangements of the exemplary embodiments are included in the scope of an exemplary aspect of the invention.

What is claimed is:

1. A method of manufacturing a semiconductor device, comprising:

forming a pad oxide film and a mask layer over a surface of a semiconductor substrate which is an active region;

forming an STI trench by etching the semiconductor substrate with use of the mask layer as an etching mask;

forming an STI region surrounding the active region by filling the STI trench with an STI insulating film;

after formation of the STI region, in a state of exposing top and side surface of the mask layer, forming a narrowed mask layer by narrowing width and thickness of the mask layer over the pad oxide film so as to expose a peripheral circuit portion of the active region from the mask layer in the plan view;

wholly forming an anti-reflective film so as to cover the narrowed mask layer;

forming, on the anti-reflective film, a photoresist having a reversed pattern of a gate electrode extending across the active region;

exposing the pad oxide film formed over the surface of the peripheral circuit portion of the active region by etching the anti-reflective film whose surface is exposed with use of the photoresist as an etching mask;

exposing the surface of the peripheral circuit portion of the active region by etching the exposed pad oxide film;

forming a pair of gate trenches and a Fin channel sandwiched between the pair of the gate trenches by etching the peripheral circuit portion of the active region with use of the STI insulating film, the narrowed mask layer, and the photoresist and the anti-reflective film, which are located adjacent to the peripheral circuit portion whose surface is exposed in the plan view, as an etching mask;

forming a gate insulating film over a surface of the Fin channel and over a bottom portion of the gate trench; and forming a gate electrode covering the gate insulating film and filling up the gate trench.

2. The method of manufacturing a semiconductor device according to claim 1, further comprising:

protecting the narrowed film pattern with a stopper film;

depositing a polysilicon film over an entire surface including the stopper film;

etching the polysilicon film with use of the reversed pattern as an etching mask; and removing the stopper film, in an order described and between the step of narrowing the width of the film pattern and the step of forming the Fin channel and the gate trench.

3. The method of manufacturing a semiconductor device according to claim 2, further comprising performing impurity ion implantation with use of the gate electrode as a mask to form source and drain regions.

4. The method of manufacturing a semiconductor device according to claim 1, further comprising performing impurity ion implantation with use of the gate electrode as a mask to form source and drain regions.

5. The method of manufacturing a semiconductor device according to claim 1, wherein a step of said narrowing the mask layer is carried out by wet etching of the the mask layer.

6. The method of manufacturing a semiconductor device according to claim 1, wherein an upper surface of the channel region of the active region is formed to a position lower than an upper surface of the isolation region.

7. The method of manufacturing a semiconductor device according to claim 1, wherein the source and drain regions each has the same width as the active region, while the channel region has a smaller width than the active region.

8. The method of manufacturing a semiconductor device according to claim 1, further comprising, after formation of the FIN channel and before formation of the gate insulating film:

removing the photoresist and the anti-reflective film which are used as the mask by ashing; and removing the narrowed mask layer and the pad oxide film which are exposed over the active region by the removal of the photoresist and the anti-reflective film by ashing.

9. The method of manufacturing a semiconductor device according to claim 1, wherein the mask layer consists of a silicon nitride film.

10. The method of manufacturing a semiconductor device according to claim 1, wherein a part of the narrowed mask layer which is covered with the anti-reflective film is also etched in the etching of the anti-reflective film.

11. The method of manufacturing a semiconductor device according to claim 1, wherein, in the formation of a pair of gate trenches and a Fin channel sandwiched between the pair of the gate trenches by etching the peripheral circuit portion of the active region, the narrowed mask layer used as the etching mask and the pad oxide film located under the narrowed mask layer disappear during the etching, and top surface of the Fin channel located under the pad oxide film is also etched.

* * * * *